(12) United States Patent
Do

(10) Patent No.: US 12,266,740 B2
(45) Date of Patent: Apr. 1, 2025

(54) FULL-COLOR LED DISPLAY USING ULTRA-THIN LED ELEMENT AND METHOD FOR MANUFACTURING THEREOF

(71) Applicant: KOOKMIN UNIVERSITY INDUSTRY ACADEMY COOPERATION FOUNDATION, Seoul (KR)

(72) Inventor: Young Rag Do, Seoul (KR)

(73) Assignee: KOOKMIN UNIVERSITY INDUSTRY ACADEMY COOPERATION FOUNDATION, Seoul (KR)

(*) Notice: Subject to any disclaimer, the term of this patent is extended or adjusted under 35 U.S.C. 154(b) by 501 days.

(21) Appl. No.: 17/564,740

(22) Filed: Dec. 29, 2021

(65) Prior Publication Data
US 2022/0310884 A1  Sep. 29, 2022

(30) Foreign Application Priority Data
Mar. 25, 2021 (KR) .................. 10-2021-0038999

(51) Int. Cl.
*H01L 33/44* (2010.01)
*H01L 23/00* (2006.01)
(Continued)

(52) U.S. Cl.
CPC ............ *H01L 33/44* (2013.01); *H01L 24/29* (2013.01); *H01L 24/95* (2013.01);
(Continued)

(58) Field of Classification Search
CPC ......... H01L 33/44; H01L 24/29; H01L 24/95; H01L 25/0753; H01L 33/24; H01L 24/83; H01L 33/145; H01L 33/32; H01L 33/62; H01L 2224/29099; H01L 2224/83143; H01L 2224/95102; H01L 2224/95144; H01L 2224/95145; H01L 2224/95147; H01L 2933/0066; H01L 24/80; H01L 24/92; H01L 24/08; H01L 24/32;
(Continued)

(56) References Cited

U.S. PATENT DOCUMENTS

| 2003/0010993 A1* | 1/2003 | Nakamura | H01L 33/06 257/99 |
| 2014/0124802 A1* | 5/2014 | Do | H01L 25/0753 257/89 |
| 2020/0035857 A1* | 1/2020 | Park | H05B 33/22 |

FOREIGN PATENT DOCUMENTS

| KR | 101490758 | 2/2015 |
| KR | 10-2015-0021613 | 3/2015 |

(Continued)

OTHER PUBLICATIONS

Office Action in corresponding Korean Application No. 10-2021-0038999, dated Oct. 17, 2022. (English Translation Provided).

*Primary Examiner* — Benjamin P Sandvik
*Assistant Examiner* — John Patrick Cornely
(74) *Attorney, Agent, or Firm* — NORTON ROSE FULBRIGHT US LLP

(57) ABSTRACT

The present disclosure relates to a full-color light-emitting diode (LED) display, and more particularly, to a full-color LED display using an ultra-thin LED element and a manufacturing method thereof.

10 Claims, 19 Drawing Sheets

X-X'

(51) Int. Cl.
  *H01L 25/075* (2006.01)
  *H01L 33/24* (2010.01)
  *H01L 33/14* (2010.01)
  *H01L 33/32* (2010.01)
  *H01L 33/62* (2010.01)

(52) U.S. Cl.
  CPC .......... *H01L 25/0753* (2013.01); *H01L 33/24* (2013.01); *H01L 24/83* (2013.01); *H01L 33/145* (2013.01); *H01L 33/32* (2013.01); *H01L 33/62* (2013.01); *H01L 2224/29099* (2013.01); *H01L 2224/83143* (2013.01); *H01L 2224/95102* (2013.01); *H01L 2224/95144* (2013.01); *H01L 2224/95145* (2013.01); *H01L 2224/95147* (2013.01); *H01L 2933/0066* (2013.01)

(58) Field of Classification Search
  CPC ....... H01L 2224/08225; H01L 33/0095; H01L 2224/291; H01L 2224/32227; H01L 2224/80948; H01L 2224/80951; H01L 2224/83192; H01L 2224/83815; H01L 2224/83951; H01L 2224/9202; H01L 2224/95133; H01L 2924/12041; H01L 2933/0041; H01L 33/50; H01L 33/0075; H01L 33/36; H01L 2933/0016; H01L 2933/0025; H01L 27/156; H01L 27/124
  See application file for complete search history.

(56) References Cited

FOREIGN PATENT DOCUMENTS

| | | |
|---|---|---|
| KR | 10-2019-0117413 | 10/2019 |
| KR | 10-2020-0011302 | 2/2020 |
| TW | 201619681 | 6/2016 |
| TW | 201624789 | 7/2016 |
| TW | 201919223 | 5/2019 |
| TW | 202045962 | 12/2020 |

* cited by examiner

Y-Y'

FULL-COLOR LED DISPLAY USING ULTRA-THIN LED ELEMENT AND METHOD FOR MANUFACTURING THEREOF

CROSS-REFERENCE TO RELATED APPLICATION

This application claims priority to and the benefit of Korean Patent Application No. 10-2021-0038999, filed on Mar. 25, 2021, the disclosure of which is incorporated herein by reference in its entirety.

BACKGROUND

1. Field of the Invention

The present disclosure relates to a full-color light-emitting diode (LED) display, and more particularly, to a full-color LED display using an ultra-thin LED element and a manufacturing method thereof.

2. Discussion of Related Art

Micro-light-emitting diodes (Micro-LEDs) and nano-LEDs may implement an excellent feeling of color and high efficiency and may be eco-friendly materials, thereby being used as core materials for various light sources or displays. In line with such market conditions, recently, research for developing shell-coated nano-cable LEDs through new nanorod LED structures or new manufacturing processes is being conducted. In addition, research on a protective film material is being conducted to achieve high efficiency and high stability of a protective film covering an outer surface of nanorods, or research and development of a ligand material advantageous for a subsequent process is also being conducted.

In line with research in this material field, display TVs using red, green, and blue micro-LEDs have also recently been commercialized. Displays or various light sources using micro-LEDs have advantages such as high performance characteristics, a very long theoretical lifetime, and very high efficiency, but the micro-LED must be individually disposed on a miniaturized electrode in a limited region, and thus, when high unit cost, high process defect rate, and low productivity are considered, due to the limitations of process technology, it is difficult to manufacture a display, which is implemented by disposing a micro-LED on the electrode with a pick and place technique, as a true high-resolution commercial display ranging from smartphones to TVs or as a light source having various sizes, shapes, and brightness. In addition, it is more difficult to individually arrange a nano-LED, which is smaller than the micro-LED, on an electrode by the pick and place technique as in the micro-LED.

In order to overcome such difficulty, Korean Patent Publication No. 10-1436123 disclosed by the inventors of the present disclosure discloses a display manufactured through a method of dropping a solution mixed with nanorod-type LEDs on sub-pixels, and then magnetically aligning nanorod-type LED elements on the electrodes by forming an electric field between two aligned electrodes to form the sub-pixels. However, in the disclosed display, electrodes for applying a current to a p-type semiconductor layer and an n-type semiconductor layer of the nanorod-type LED element are disposed spaced apart in a horizontal direction, and thus, there is a problem in that in that it is not easy to arrange electrodes horizontally and vertically for addressing when manufacturing sub-pixels. In addition, the nanorod-type LED used in the disclosed display has low efficiency due to a small area from which light is extracted, and thus there is a problem that a large number of LEDs must be mounted in order to exhibit the desired efficiency, and there is a high possibility of unavoidable defects due to the manufacturing process characteristics of the nanorod-type LED itself.

When describing in detail the unavoidable defects in the nanorod-type LED itself, nanorod-type LED elements are known to be manufactured by manufacturing an LED wafer by a top-down method by mixing nanopatterning and dry etching/wet etching or growing an LED wafer directly on a substrate by a bottom-up method. These nanorod-type LEDs have a narrow emission area because a major axis of the LED matches a stacking direction, that is, a stacking direction of each layer in a p-GaN/InGaN multi-quantum well (MQW)/n-GaN stacked structure, and thus, surface defects have a great influence on emission efficiency, and since an area of a side surface formed by etching is relatively greater than that of an upper or lower surface, the degradation in emission efficiency due to the surface defects is inevitably large. In addition, it is difficult to optimize an electron-hole recombination rate, and thus there is a problem in that the emission efficiency of the nanorod-type LED is significantly lower than that of the original wafer.

Therefore, there is an urgent need to develop a display based on a new LED material that may more easily implement an electrode arrangement for addressing when manufacturing sub-pixels, has a wide emission area, minimizes or prevents a decrease in efficiency due to surface defects, and has an optimized electron-hole recombination rate.

SUMMARY OF THE INVENTION

The present disclosure is directed to providing a method of manufacturing a full-color light-emitting diode (LED) display capable of easily implementing a large-area display using an LED material suitable for ink formation, and a full-color LED display implemented through the same.

The present disclosure is also directed to providing a method of manufacturing a full-color LED display with improved luminance using an LED material that minimizes or prevents a decrease in efficiency due to surface defects and has an optimized electron-hole recombination rate, and a full-color LED display implemented through the same.

The present disclosure is also directed to providing a full-color LED display capable of more easily designing and implementing an electrode arrangement for addressing when implementing sub-pixels of the display, and a manufacturing method thereof.

According to an aspect of the present disclosure, there is provided a full-color LED display, including a lower electrode line including a first electrode on which a plurality of sub-pixel sites are formed, a plurality of ultra-thin LED elements emitting light of substantially the same color, which are disposed so that at least two thereof are provided in each of the sub-pixel sites, and each of which includes a first conductive semiconductor layer, a photoactive layer, and a second conductive semiconductor layer, has a ratio, between a thickness, which is a stacking direction of layers, and a length of a major axis in a cross section perpendicular to the stacking direction, of 1:0.5 to 1.5, and is disposed upright on the first electrode in the stacking direction of the layers, an upper electrode line including a second electrode disposed on the plurality of ultra-thin LED elements, and a color conversion layer patterned on the second electrode corresponding to the sub-pixel site so that each sub-pixel site becomes a sub-pixel site expressing one of blue, green, and red colors.

According another aspect of the present disclosure, there is provided a full-color LED display, including a lower electrode line including a first electrode on which a plurality of sub-pixel sites are formed, a plurality of ultra-thin LED elements, each of which independently emits blue, green, or red light, includes a first conductive semiconductor layer, a photoactive layer, and a second conductive semiconductor layer, and has a ratio, between a thickness, which is a stacking direction of layers, and a length of a major axis in a cross section perpendicular to the stacking direction, of 1:0.5 to 1:1.5, wherein at least two elements emitting light of substantially the same color are disposed in each of the sub-pixel sites so that each of the plurality of sub-pixel sites independently expresses any one of blue, green, and red colors, and an upper electrode line including a second electrode disposed to be in contact with upper portions of the plurality of ultra-thin LED elements.

The full-color LED display further includes an alignment-inducing layer configured to allow the ultra-thin LED element to be disposed upright in a thickness direction, and formed on one side of the ultra-thin LED element in the thickness direction and on one side or both sides of the sub-pixel site in the first electrode, wherein the alignment-inducing layer may be a magnetic layer, a charge layer, or a bonding layer.

The ultra-thin LED element may have a maximum area of 16 μm$^2$ or less.

The ultra-thin LED element may have a thickness of 2.7 μm or less, more preferably a thickness of 2.0 μm or less, and yet more preferably 0.2 to 1.0 μm.

In the ultra-thin LED element, the first conductive semiconductor layer may be an n-type III-nitride semiconductor layer, and an electron delay layer may be further included on a surface opposite to one surface of the first conductive semiconductor layer adjacent to the photoactive layer so that the number of electrons and holes recombined in the photoactive layer is balanced.

The electron delay layer may include at least one selected from the group consisting of CdS, GaS, ZnS, CdSe, CaSe, ZnSe, CdTe, GaTe, SiC, ZnO, ZnMgO, SnO$_2$, TiO$_2$, In$_2$O$_3$, Ga$_2$O$_3$, Si, polyparaphenylene vinylene, derivatives thereof, polyaniline, poly(3-alkylthiophene), and poly(paraphenylene).

The first conductive semiconductor layer may be a doped n-type III-nitride semiconductor layer, and the electron delay layer may be a III-nitride semiconductor having a lower doping concentration than the first conductive semiconductor layer.

The ultra-thin LED element may further include a protective film surrounding exposed side surfaces of the ultra-thin LED element.

The first conductive semiconductor layer of the ultra-thin LED element may be an n-type III-nitride semiconductor layer, the second conductive semiconductor layer of the ultra-thin LED element may be a p-type III-nitride semiconductor layer, and the ultra-thin LED element further may include at least one film of a hole pushing film configured to surround exposed side surfaces of the second conductive semiconductor layer or the exposed side surfaces of the second conductive semiconductor layer and exposed side surfaces of at least a portion of the photoactive layer, and move holes at a surface side of the exposed side surface toward a center, and an electron pushing film configured to surround exposed side surfaces of the first conductive semiconductor layer and move electrons at a surface side of the exposed side surface toward a center.

The ultra-thin LED element may include both the hole pushing film and the electron pushing film, wherein the electron pushing film is provided as an outermost film configured to surround side surfaces of the first conductive semiconductor layer, the photoactive layer, and the second conductive semiconductor layer.

The hole pushing film may include at least one selected from the group consisting of AlN$_x$, ZrO$_2$, MoO, Sc$_2$O$_3$, La$_2$O$_3$, MgO, Y$_2$O$_3$, Al$_2$O$_3$, Ga$_2$O$_3$, TiO$_2$, ZnS, Ta$_2$O$_5$, and n-MoS$_2$.

The electron pushing film may include at least one selected from the group consisting of Al$_2$O$_3$, HfO$_2$, SiN$_x$, SiO$_2$, ZrO$_2$, Sc$_2$O$_3$, AlN$_x$, and Ga$_2$O$_3$.

The light color may be blue, white, or ultraviolet (UV).

According to still another aspect of the present disclosure, there is provided a method of manufacturing a full-color light-emitting diode (LED) display, the method including operation (1) of preparing a lower electrode line including a first electrode on which a plurality of sub-pixel sites are formed, operation (2) of processing an ink composition including a plurality of ultra-thin LED elements, each of which includes a first conductive semiconductor layer, a photoactive layer, and a second conductive semiconductor layer, which are stacked, emits light of substantially the same color, and has a ratio, between a thickness, which is a stacking direction and a length of a major axis in a cross section perpendicular to the stacking direction, of 1:0.5 to 1:1.5, on the first electrodes so that at least two ultra-thin LED elements are disposed in each of the sub-pixel sites, operation (3) of assembling the processed ultra-thin LED elements on the first electrode to be upright in a thickness direction in the sub-pixel site, operation (4) of forming an upper electrode line including a second electrode to be electrically connected to a side opposite to one side of the ultra-thin LED element assembled on the first electrode, and operation (5) of patterning a color conversion layer on the second electrode corresponding the sub-pixel site so that the sub-pixel site becomes a sub-pixel site expressing any one of blue, green, and red colors in each of the plurality of sub-pixel sites.

According to yet another aspect of the present disclosure, there is provided a method of manufacturing a full-color LED display, the method including operation (I) of preparing a lower electrode line including a first electrode on which a plurality of sub-pixel sites are formed, operation (II) of processing a blue ultra-thin LED element ink composition, a green ultra-thin LED element ink composition, and a red ultra-thin LED element ink composition each including a plurality of ultra-thin LED elements for each light color, each of which includes a first conductive semiconductor layer, a photoactive layer, and a second conductive semiconductor layer, which are stacked, and has a ratio, between a thickness, which is a stacking direction and a length of a major axis of a cross section perpendicular to the stacking direction, of 1:0.5 to 1:1.5, on the first electrode, wherein the ink compositions are processed so that the plurality of sub-pixel sites each independently express any one of blue, green, and red light colors, and at least two ultra-thin LED elements are disposed in each of the sub-pixel sites, operation (III) of assembling the processed ultra-thin LED elements on the first electrode to be upright in a thickness direction in the sub-pixel site, and operation (IV) of forming an upper electrode line including a second electrode to be electrically connected to a side opposite to one side of the ultra-thin LED element assembled to the first electrode.

A magnetic layer may be further provided on one side of the ultra-thin LED element in the thickness direction and on the first electrode in the sub-pixel site, and in operations (3) and (III), a magnetic field may be formed in a direction perpendicular to the main surface of the first electrode so that the ultra-thin LED element is moved to the sub-pixel site and disposed upright in the thickness direction.

A first charge layer having positive charges or a negative charges may be further provided on one side of the ultra-thin LED element in the thickness direction, a second charge layer having charges opposite to those of the first charge layer is further provided on the first electrode in the sub-pixel site, and in operations (3) and (III), an electric field may be formed in a direction perpendicular to the main surface of the first electrode so that the ultra-thin LED element is moved to the sub-pixel site and disposed upright in the thickness direction.

In operations (3) and (III), the ultra-thin LED element may be assembled upright on the first electrode in the sub-pixel site through chemical bonding through a bonding layer between one side of the ultra-thin LED element in the thickness direction and the first electrode in the sub-pixel site, and the bonding layer may be provided on one side of the ultra-thin LED element in the thickness direction and one or both sides of the first electrode in the sub-pixel site.

Hereinafter, the terms used in the present disclosure will be defined.

In descriptions of embodiments of the present disclosure, it should be understood that when, a layer, region, or pattern is referred to as being "on," "above," "under," or "below" a substrate, another layer, another region, or another pattern, the terminology of "on," "above," "under," or "below" includes both the meanings of "directly" and "indirectly" "on," "above," "under," or "below."

The present invention has been researched under support of National Research and Development Project, and specific information of National Research and Development Project is as follow:

[Project Series Number] 1711130702

[Project Number] 2021R1A2C2009521

[Government Department Name] Ministry of Science and ICT

[Project Management Authority Name] Korea Evaluation Institute of Industrial Technology

[Research Program Name] Middle-level Researcher Support Project

[Research Project Name] Development of dot-LED material and display source/application technology

[Contribution Ratio]

[Project Execution Organization Name] Kookmin University Industry Academic Cooperation Foundation

[Period of Research] Mar. 1, 2021 to Feb. 28, 2022

[Project Series Number] 1711105790

[Project Number] 2016R1A5A1012966

[Government Department Name] Ministry of Science and ICT

[Project Management Authority Name] National Research Foundation of Korea

[Research Program Name] Science and Engineering Research Center (S/ERC)

[Research Project Name] Circadian ICT research center using hybrid device

[Contribution Ratio]

[Project Execution Organization Name] Kookmin University Industry Academic Cooperation Foundation

[Period of Research] Jan. 1, to Dec. 31, 2021

BRIEF DESCRIPTION OF THE DRAWINGS

The above and other objects, features, and advantages of the present disclosure will become more apparent to those of ordinary skill in the art by describing exemplary embodiments thereof in detail with reference to the accompanying drawings, in which.

DETAILED DESCRIPTION OF EXEMPLARY EMBODIMENTS

Hereinafter, embodiments of the present disclosure will be described in detail with reference to the accompanying drawings such that those skilled in the art to which the present disclosure can easily carry out the present disclosure. The present disclosure may be implemented in several different forms, and are not limited to the embodiments described herein.

First, as a display according to a first embodiment of the present disclosure, a full-color light-emitting diode (LED) display implemented with LED elements emitting light of substantially the same color will be described.

Figure 1:
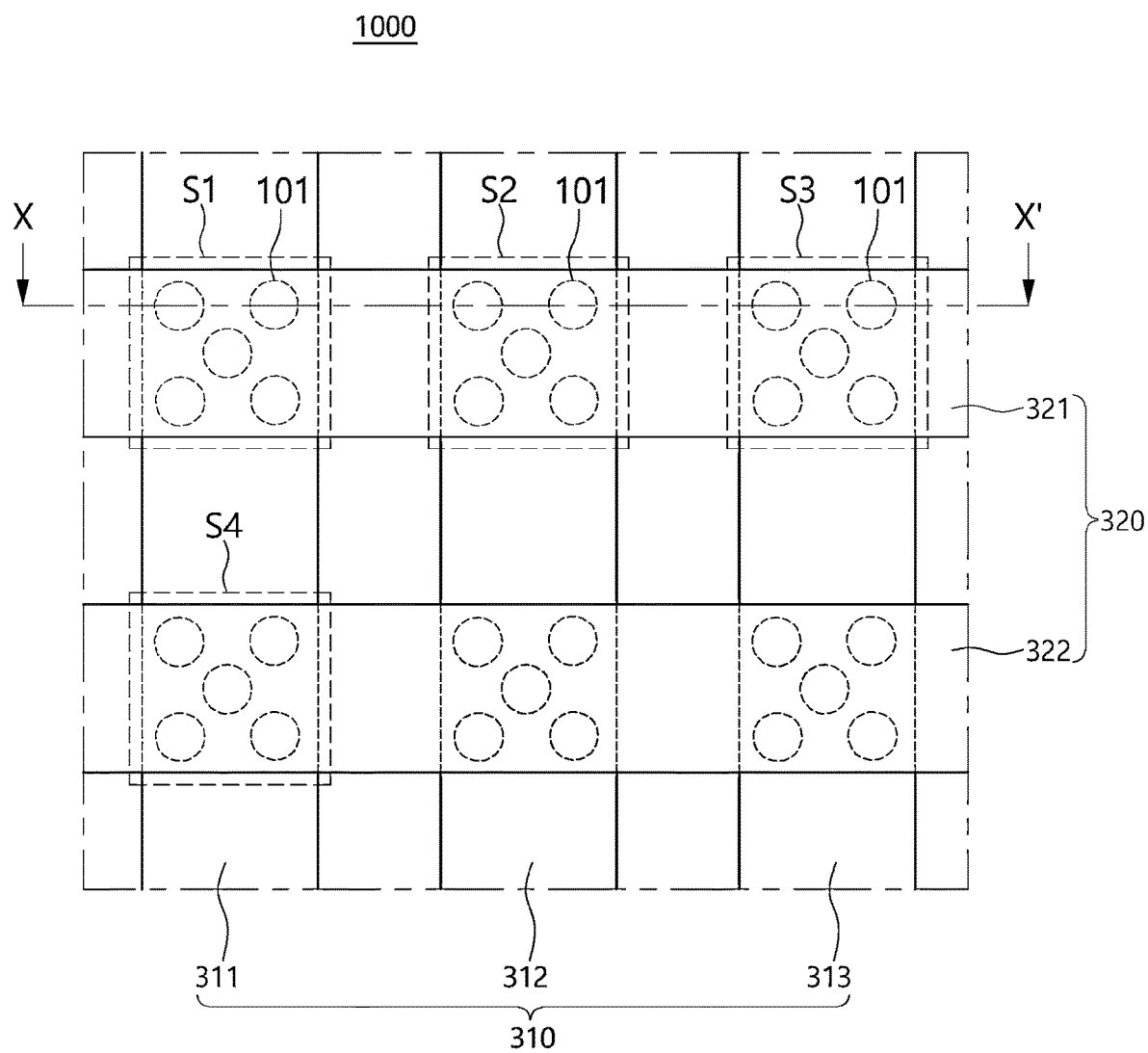
FIGS. 1 and 2 are a schematic plan view of a full-color light-emitting diode (LED) display according to a first embodiment of the present disclosure and a schematic cross-sectional view taken along boundary line X-X' of FIG. 1, respectively.
Figure 2:
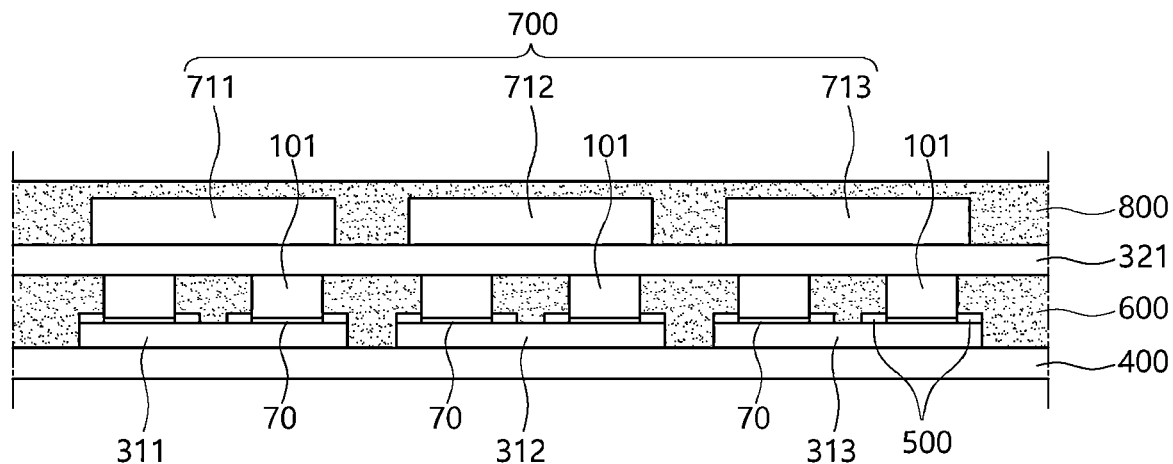

When describing with referring to FIGS. 1 and 2, a full-color LED display 1000 according to the first embodiment of the present disclosure may be implemented by including lower electrode lines 310 including first electrodes 311, 312, and 313 in which a plurality of sub-pixel sites S1, S2, S3, and S4 are formed, a plurality of ultra-thin LED elements 101, which are disposed so that at least two are provided in each of the sub-pixel sites S1, S2, S3, and S4 and arranged to be erected in a stacking direction of layers on the first electrodes 311, 312, and 313, upper electrode lines 320 including second electrodes 321 and 322 disposed in contact with upper portions of the plurality of ultra-thin LED elements 101, and a color conversion layer 700 patterned on the upper electrode line 320 so that the sub-pixel sites S1, S2, S3, and S4 respectively become sub-pixel sites S1, S2, S3, and S4 each expressing any one of blue, green, and red colors.

First, the electrode lines that allow the ultra-thin LED elements to emit light will be described before describing each component in detail.

The display 1000 according to the first embodiment of the present disclosure includes the upper electrode line 320 and the lower electrode line 310 disposed to face each other above and below the ultra-thin LED elements 101 with the ultra-thin LED elements 101 therebetween. Since the upper electrode lines 320 and the lower electrode lines 310 are not horizontally arranged, electrodes may be very simply designed and may be implemented more easily by breaking away from the complicated electrode line in the conventional display by electric field induction, in which two types of electrodes implemented to have ultra-small thicknesses and widths are arranged to have micro- or nano-scale spacing in a horizontal direction in a plane of a limited area. In addition, since thin-film transistors (TFTs) are also easily arranged, in addition to active matrix driving, passive matrix driving, which is x-y matrix driving, is also possible, which makes it much easier to implement various types of displays.

Further, the lower electrode lines 310 and the upper electrode lines 320 may include the plurality of first electrodes 311, 312, and 313 and the plurality of second electrodes 321 and 322, respectively, and the number, spacing, arrangement shape, and the like thereof may be appropriately modified in consideration of the area, luminance, and the like of the display to be implemented, and thus, the present disclosure is not particularly limited thereto.

Further, when the upper electrode lines 320 are designed to be in electrical contact with the upper portions of the ultra-thin LED elements 101 mounted on the lower electrode lines 310, there is no limitation on the number and arrangement shape of the upper electrode line 320. However, as shown in FIG. 1, when the lower electrode lines 310 are arranged in parallel in one direction, the upper electrode lines 320 may be arranged to be perpendicular to the one direction, and such an electrode arrangement is an electrode arrangement widely used in a conventional display and the like, and thus there is an advantage in that the electrode arrangement and control technology of the conventional display field may be used as it is.

Further, the lower electrode line 310 and the upper electrode line 320 may each have a material, a shape, a width, and a thickness of an electrode used for a display using a conventional LED, and may be manufactured using a known method, and thus the present disclosure is not particularly limited thereto. As an example, the first electrodes 311, 312, and 313 and the second electrodes 321 and 322 may each independently include aluminum, chromium, gold, silver, copper, graphene, ITO, or alloys thereof, and may have a width of 2 to 50 μm and a thickness of 0.1 to 100 μm, which may be appropriately changed in consideration of the size and the like of the desired LED display.

According to one embodiment of the present disclosure, the sub-pixel sites S1, S2, S3, and S4, in which the ultra-thin LED elements 101 are to be disposed, may be formed on the first electrodes 311, 312, and 313. The sub-pixel sites S1, S2, S3, and S4 may be variously set according to the purpose, and as shown in FIG. 1, the sub-pixel sites may be set to be spaced apart from each other by a predetermined interval, but the present disclosure is not limited thereto. Meanwhile, the sub-pixel sites S1, S2, S3, and S4 refer to virtual regions configured to partition main surfaces of the first electrodes 311, 312, and 313.

Further, the sub-pixel site may have a unit area of 100 μm×100 μm or less, 30 μm×30 μm or less as another example, and 20 μm×20 μm or less as still another example, and the unit area of such a size is an area reduced compared to a unit sub-pixel area of a display using an LED, and thus it is possible to achieve a large area while minimizing an area ratio occupied by the LED, which may be advantageous for realizing a high-resolution display. Meanwhile, the unit areas of the sub-pixel sites may be different from each other. In addition, a separate surface treatment may be performed on surfaces of the sub-pixel sites or grooves may be formed on the surfaces of the sub-pixel sites.

Meanwhile, although the arrangement of electrodes such as a data electrode and a gate electrode provided in a typical display is not illustrated in FIG. 1, the arrangement of the electrodes used in the typical display may be employed for the arrangement of the electrodes not illustrated in the drawing.

Next, the ultra-thin LED elements 101 disposed between the lower electrode lines 310 and the upper electrode lines 320 described above will be described.

The ultra-thin LED elements 101 are disposed so that at least two are included in each of the plurality of sub-pixel sites S1, S2, S3, and S4 on the first electrodes 311, 312, and 313, and thus, even when a defective element is included in the ultra-thin LED elements 101 arranged in each sub-pixel, it is possible to minimize or prevent the generation of bad pixels in the display by allowing all sub-pixels to emit a certain light.

Further, the ultra-thin LED elements 101 provided in each of the sub-pixel sites S1, S2, S3, and S4 emit light having substantially the same light color. Here, the term "substantially the same light color" does not refer to completely the same wavelength of emitted light and refers to light in a wavelength band in which light generally referred to as light having the same light color is included. As an example, when the light color is blue, all ultra-thin LED elements configured to emit light in a wavelength band of 420 to 470 nm may be understood as emitting light having substantially the same light color. The ultra-thin LED element provided in the display according to the first embodiment of the present disclosure may emit, for example, blue light, white light, or ultraviolet (UV) light.

When the ultra-thin LED elements 101, at least two of which are disposed in each of the sub-pixel sites S1, S2, S3, and S4, are described with reference to FIGS. 5 and 6, each of the ultra-thin LED elements 101 includes a first conductive semiconductor layer 10, a photoactive layer 20, and a second conductive semiconductor layer 30, and may further include a second electrode layer 60 formed below the first conductive semiconductor layer 10, a first electrode layer 40 formed on the second conductive semiconductor layer 30, and an alignment-inducing layer 70 formed on the outermost side of the second conductive semiconductor layer 30 side.

The above-described layers may be stacked in any one direction, and a ratio between a thickness in a stacking direction and a length of a major axis in a cross section perpendicular to the stacking direction may satisfy a range of 1:0.5 to 1:1.5, preferably a range of 1:0.8 to 1:1.2, and more preferably a range of 1:0.9 to 1:1.1. Thus, when the ultra-thin LED element is implemented as inkjet ink, the ultra-thin LED element may exhibit excellent dispersibility in a dispersion medium and may be advantageous in maintaining a dispersed state without precipitation for a long time. In addition, due to a geometrical structure suitable for ink formation, there is no need for a separate additive for maintaining a dispersed state, and thus, there is an advantage in that contamination of the lower electrode line 310 or a circuit board due to the separate additive may be prevented in advance. Furthermore, when ink including the ultra-thin LED elements is printed on the lower electrode lines 310, most conventional nanorod-type LED elements with a large aspect ratio are positioned lying down on the electrode, and the ultra-thin LED element has an advantage of reducing the probability of being arranged lying down on the electrode. In addition, since the elements are assembled on the first electrode in a thickness direction through the alignment-inducing layer 70 formed on either side of the thickness direction, it is possible to reduce the probability that the plurality of elements are assembled in different directions when assembled, in other words, the probability that a p-type conductive semiconductor layer and an n-type conductive semiconductor layer are assembled in different directions on the first electrode, thereby reducing electrical leakage due to a reverse arrangement and improving a lifetime. Here, the length of the major axis refers to a diameter when a shape of a cross section is a circular shape, a length of a major axis when a shape of a cross section is an elliptic shape, or a length of the longest side when a shape of a cross section is a polygonal shape. Meanwhile, when cross sections of the ultra-thin LED element are not the same in a thickness direction, the cross section refers to the largest cross section among the cross sections.

In addition, a ratio between a length of a minor axis and the length of the major axis in the cross section may also satisfy a range of 1:0.5 to 1:1.5, preferably a range of 1:0.8 to 1:1.2, and more preferably a range of 1:0.9 to 1:1.1, and through this, it may be more advantageous in achieving the above-described objects of the present disclosure. Even though the ratio between the thickness and the length of the major axis satisfies a range of 1:0.5 to 1:1.5, when the ratio between the length of the minor axis and the length of the major axis in the cross section deviates a range of 1:0.5 to 1:1.5, it may be difficult for the LED elements to remain dispersed in the dispersion medium for a long time, and thus, the LED element may be unsuitable for being formed into ink. In addition, in order for the LED elements, which have a geometrical structure unsuitable for such ink formation, to remain dispersed in a dispersion medium for a long time, it is necessary to further add an additive, and thus, there is a risk of contaminating a driving electrode or circuit board due to the use of the additive. Here, the length of the minor axis in the cross section means a longest length among lengths of axes perpendicular to the major axis.

Figure 5:
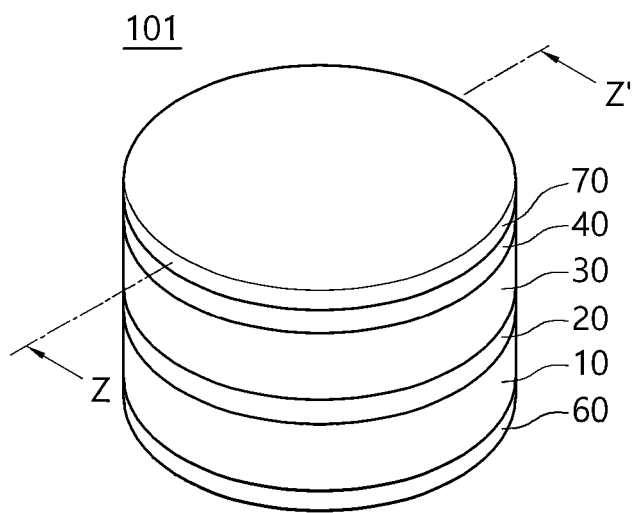
FIG. 5 is a perspective view of an ultra-thin LED element used in one embodiment of the present disclosure.

Meanwhile, although, in the ultra-thin LED element 101 shown in FIG. 5, cross sections of layers perpendicular to the stacking direction are illustrated as having the same size, the present disclosure is not limited thereto, and the cross sections may have different sizes according to thicknesses.

In addition, a shape of the ultra-thin LED element 101 may be a cylindrical shape as shown in FIG. 5 but is not limited thereto, and the ultra-thin LED element 101 may have not only a polyhedral shape such as a hexahedral shape, an octahedral shape, or a decahedral shape but also an atypical shape having a star-shaped surface.

According to one embodiment of the present disclosure, since a sedimentation rate is slow during ink formation, in order to improve dispersion retention performance capable of continuously maintaining a dispersed state, the ultra-thin LED element 101 may have a maximum surface area of 16 $\mu m^2$ or less, more preferably a maximum surface area of 9 $\mu m^2$ or less, still more preferably a maximum surface area of 4 $\mu m^2$ or less, and yet more preferably a maximum surface area of 0.1 $\mu m^2$ to 2.5 $\mu m^2$. Here, the maximum surface area refers to a maximum value among areas of a vertical projection surface for the ultra-thin LED element. When the maximum surface area exceeds 16 $\mu m^2$, a sedimentation rate is high, and thus, there may be limitations in that dispersion retention performance is likely to be degraded, the ultra-thin LED element is unsuitable for being manufactured as ink, or a separate additive should be further added or a specific dispersion medium should be used for ink formation.

According to one embodiment of the present disclosure, the ultra-thin LED element 101 may have a thickness of 2.7 $\mu m$ or less, more preferably a thickness of 2.0 $\mu m$ or less, and yet more preferably 0.2 to 1.0 $\mu m$, which may be more suitable for maintaining a dispersed state for a long time during ink formation.

However, in the case of an LED element, when a thickness thereof is implemented to be thin, a position at which electrons and holes are combined deviates from the photoactive layer 20, thereby resulting in a decrease in emission efficiency. In particular, when a large-area LED wafer is etched to implement the ultra-thin LED elements, thicknesses of the first conductive semiconductor layer, the photoactive layer, and the second conductive semiconductor layer are already determined in a state of the LED wafer, and only portions thereof are etched to a thickness different from a thickness of each of the layers in the wafer, which is already determined to achieve a certain level of emission efficiency, to be implemented as the ultra-thin LED element. Thus, such a problem inevitably occurs. Such a change in position at which electrons and holes are combined is caused due to a difference in velocity between electrons and holes moving in conductive semiconductor layers. For example, in an n-type GaN conductive semiconductor layer, electrons have a mobility of 200 $cm^2/Vs$, and in a p-type GaN conductive semiconductor layer, holes have a mobility of only 5 $cm^2/Vs$. Thus, due to such an electron-hole velocity imbalance, a position at which electrons and holes are combined may vary according to a thickness of the p-type GaN conductive semiconductor layer and a thickness of the n-type GaN conductive semiconductor layer and may deviate from the photoactive layer.

Figure 8:
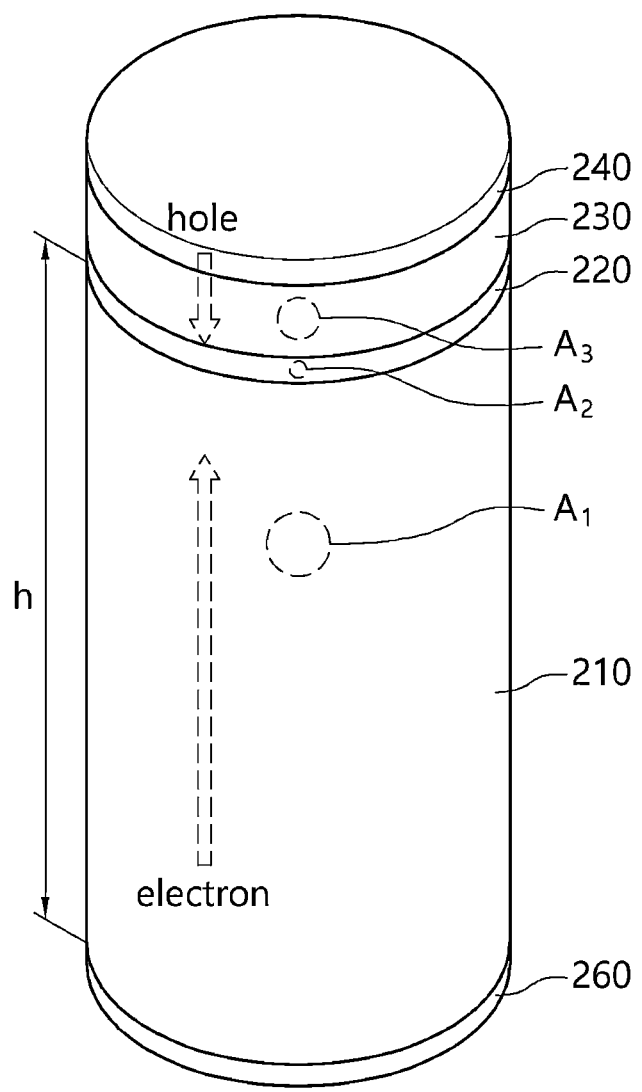
FIG. 8 is a schematic view for describing a balance between electrons and holes in an LED element.

When describing this with reference to FIG. 8, in an LED element 200 having a diameter of about 600 nm in which an n-type GaN conductive semiconductor layer 210, a photoactive layer 220, and a p-type GaN conductive semiconductor layer 230 are stacked, in consideration of electron mobility of the n-type GaN conductive semiconductor layer 210 and hole mobility of the p-type GaN conductive semiconductor layer 230, when a thickness is designed to balance the numbers of electrons and holes recombined at a point $A_2$ in the photoactive layer 220, a thickness h of the n-type GaN conductive semiconductor layer 210 inevitably needs to be thick, and thus, unless a thickness of the p-type GaN conductive semiconductor layer 230 is implemented to be very thin, the LED element is very likely to be implemented as a rod-type LED element having a great length in a thickness direction thereof. In other words, in the case of an LED element in which a thickness of each layer is designed such that a position at which the numbers of recombined electrons and holes are balanced is in the photoactive layer 220, although a length of a major axis in one end cross section perpendicular to a thickness direction may be implemented to be short, since it is difficult to decrease a thickness of the LED element so as to be less than or equal to a certain level, as a result, a rod-type LED element formed to be elongated in a thickness direction of the LED element is inevitably implemented. Thus, even when the numbers of holes and electrons recombined in the photoactive layer are balanced, it may be inappropriate to implement the LED element as ink. In addition, when the thickness of the n-type GaN conductive semiconductor layer 210 is implemented to be thin so as to be suitable for implementation as ink, as a position at which the numbers of recombined electrons and holes are balanced is shifted from the photoactive layer 220 to a certain point $A_3$ in the p-type GaN conductive semiconductor layer 230, emission efficiency may be degraded.

Accordingly, the ultra-thin LED element provided in one embodiment of the present disclosure may have a geometric structure suitable for being implemented as ink and also may further include an electron delay layer adjacent to the n-type conductive semiconductor layer so as to balance the numbers of holes and electrons recombined in the photoactive layer to prevent a degradation in emission efficiency. When describing this with reference to FIG. 9, when a first conductive semiconductor layer is an n-type conductive semiconductor, an ultra-thin LED element 102 may include an electron delay layer 50 on a first conductive semiconductor layer 10. Accordingly, even when a thickness of the first conductive semiconductor layer 10 is implemented to be thin, it is possible to prevent a degradation in emission efficiency. In addition, the reduced thickness of the first conductive semiconductor layer 10 may decrease the probability that electrons are captured by surface defects while moving in a thickness direction of the first conductive semiconductor layer 10, thereby minimizing emission loss.

The electron delay layer 50 may include, for example, at least one selected from the group consisting of CdS, GaS, ZnS, CdSe, CaSe, ZnSe, CdTe, GaTe, SiC, ZnO, ZnMgO, $SnO_2$, $TiO_2$, $In_2O_3$, $Ga_2O_3$, silicon (Si), polyparaphenylene vinylene, derivatives thereof, polyaniline, poly(3-alkylthiophene), and poly(paraphenylene). In addition, as another example, when the first conductive semiconductor layer 10 is a doped n-type III-nitride semiconductor layer, the electron delay layer 50 has a III-nitride semiconductor having a lower doping concentration than the first conductive semiconductor layer 10.

Further, the electron delay layer 50 may have a thickness of 1 nm to 100 nm, but is not limited thereto, and the thickness of the electron delay layer 50 may be appropriately changed in consideration of a material of an n-type conductive semiconductor layer, a material of the electron delay layer, and the like.

Hereinafter, each layer of the ultra-thin LED element 101 provided in one embodiment of the present disclosure will be described in detail.

One of the first conductive semiconductor layer 10 and a second conductive semiconductor layer 30 may be an n-type semiconductor layer, and the other thereof may be a p-type semiconductor layer. A known semiconductor layer applied to an LED may be used as the n-type semiconductor layer and the p-type semiconductor layer without limitation. As an example, the n-type semiconductor layer and the p-type semiconductor layer may include Group III-V semiconductors referred to as III-nitride materials, in particular binary, ternary, and quaternary alloys of gallium, aluminum, indium, and nitrogen.

As an example, the first conductive semiconductor layer 10 may be an n-type semiconductor layer. In this case, the n-type semiconductor layer may include a semiconductor material having a composition formula of $In_xAl_yGa_{1-x-y}N$ ($0 \leq x \leq 1$, $0 \leq y \leq 1$, and $0 \leq x+y \leq 1$), for example, at least one selected from among InAlGaN, GaN, AlGaN, InGaN, AlN, InN, and the like and may be doped with a first conductive dopant (for example, Si, germanium (Ge), or tin (Sn)). According to one embodiment of the present disclosure, the first conductive semiconductor layer 10 may have a thickness of 100 nm to 1,800 nm, but the present disclosure is not limited thereto.

Further, the second conductive semiconductor layer 30 may be a p-type semiconductor layer. In this case, the p-type semiconductor layer may include a semiconductor material having a composition formula of $In_xAl_yGa_{1-x-y}N$ ($0 \leq x \leq 1$, $0 \leq y \leq 1$, and $0 \leq x+y \leq 1$), for example, at least one selected from among InAlGaN, GaN, AlGaN, InGaN, AlN, and InN, and the like and may be doped with a second conductive dopant (for example, magnesium (Mg)). According to one exemplary embodiment of the present disclosure, the second conductive semiconductor layer 30 may have a thickness of 50 nm to 150 nm, but the present disclosure is not limited thereto.

Further, a photoactive layer 20 positioned between the first conductive semiconductor layer 10 and the second conductive semiconductor layer 30 may be formed to have a single or multi-quantum well structure. A photoactive layer included in a typical LED element used for lighting, a display, and the like may be used as the photoactive layer 20 without limitation. A clad layer (not shown) doped with a conductive dopant may be formed above and/or below the photoactive layer 20, and the clad layer doped with the conductive dopant may be implemented as an AlGaN layer or an InAlGaN layer. In addition, a material such as AlGaN or AlInGaN may be used for the photoactive layer 20. In the photoactive layer 20, when an electric field is applied to an element, electrons and holes moving from the conductive semiconductor layers positioned above and below the photoactive layer to the photoactive layer are recombined to generate electron-hole pairs in the photoactive layer, thereby emitting light. According to an exemplary embodiment of the present disclosure, the photoactive layer 20 may have a thickness of 50 nm to 200 nm, but the present disclosure is not limited thereto.

Meanwhile, a second electrode layer 60 may be provided below the first conductive semiconductor layer 10 described above. Alternatively, the electron delay layer 50 may be further provided between the first conductive semiconductor layer 10 and the second electrode layer 60. In addition, a first electrode layer 40 may be provided on the second conductive semiconductor layer 30 described above.

Figure 9:
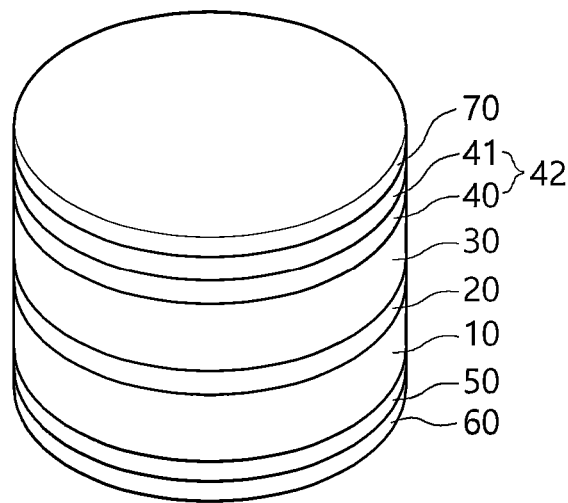
FIG. 9 is a perspective view of an ultra-thin LED element used in one embodiment of the present disclosure.

An electrode layer included in a typical LED element used for lighting, a display, and the like may be used as the first electrode layer 40 and the second electrode layer 60 without limitation. The first electrode layer 40 and the second electrode layer 60 are each independently a single layer made of one selected from among Cr, Ti, Al, Au, Ni, ITO, and oxides or alloys thereof, a single layer made of two or more thereof, or a composite layer in which two or more materials thereof each constitute a layer. As an example, as shown in FIG. 9, the ultra-thin LED element 102 may include a first electrode layer 42 in which an ITO electrode layer 40 and a Ti/Au composite layer 41 are stacked on the second conductive semiconductor layer 30. In addition, the first electrode layer 40 and the second electrode layer 60 may each independently have a thickness of 10 nm to 500 nm, but the present disclosure is not limited thereto.

Further, the alignment-inducing layer 70 for arranging the ultra-thin LED elements upright in the thickness direction may be formed on one side of the ultra-thin LED element 101 in the thickness direction and on one side or both sides of the sub-pixel sites S1, S2, S3, and S4 in which the ultra-thin LED elements 101 are to be disposed on the first electrodes 311, 312, and 313. The alignment-inducing layer induces the ultra-thin LED element 101 to move onto the desired region on the first electrodes 311, 312, and 313, that is, onto the sub-pixel sites S1, S2, S3, and S4, and performs a role of arranging the ultra-thin LED element 101 upright on the first electrodes 311, 312 and 313. The alignment-inducing layer may be formed on a side of the ultra-thin LED element 101 and/or on a desired region on the first electrodes 311, 312, and 313, for example, on the sub-pixel sites S1, S2, S3, and S4.

When describing the case in which the alignment-inducing layer is formed only on the first electrodes 311, 312, and 313, the alignment-inducing layer may be a metal portion of the ultra-thin LED element 101, for example, a bonding layer that may be chemically bonded to the first electrode layer and/or the second electrode layer. Here, the bonding layer may be a layer formed such that, for example, a thiol group is exposed to the outside.

Figure 7A:
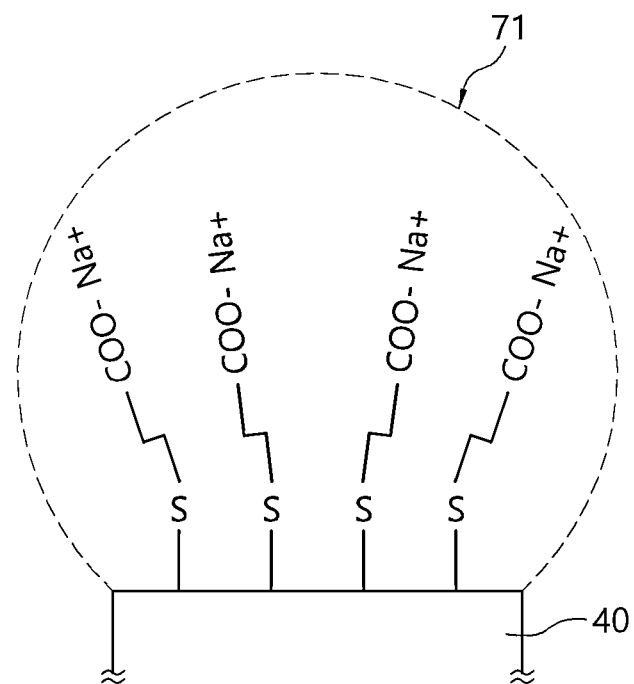
FIGS. 7A to 7C are views of various examples of an alignment-inducing layer that may be provided in the ultra-thin LED element used in one embodiment of the present disclosure.
Figure 7B:
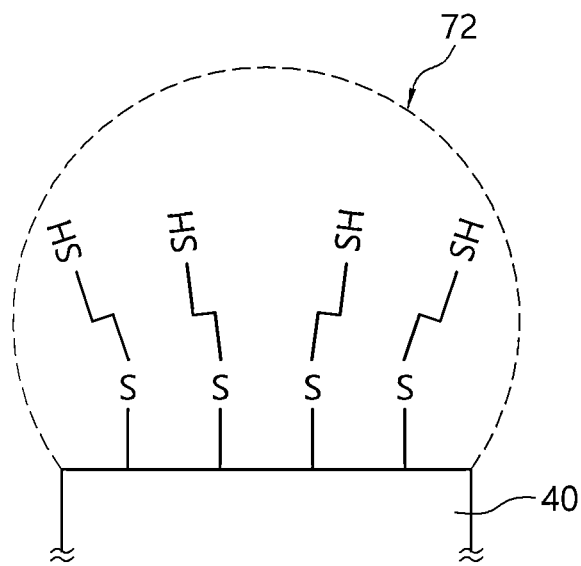
Figure 7C:
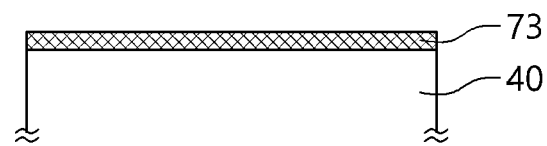

Further, when describing the case in which the alignment-inducing layer is formed on the ultra-thin LED element 101, the alignment-inducing layer 70 may be further included on the first electrode layer 40 as shown in FIGS. 5 and 7A to 7C. The material of the alignment-inducing layer 70 may be changed according to a specific induction and bonding method. For example, the alignment-inducing layer 70 may be a charge layer having positive charges or negative charges, and specifically, may be a charge layer 71 having negative charges as shown in FIG. 7A. The charge layer 71 may allow the ultra-thin LED elements to be induced to the first electrode, disposed upright, and assembled through an electrophoresis method to be described below. Alternatively, as shown in FIG. 7B, the alignment-inducing layer may be a bonding layer 72, and a functional group exposed to the bonding layer 72 may be chemically bonded to another functional group provided on the first electrode, or bonded to the first electrode made of a metal material through chemical bonding, for example, adsorption. In addition, the alignment-inducing layer 70 may be a magnetic layer 73 as shown in FIG. 7C, and the magnetic layer 73 may be assembled on the first electrodes 311, 312 and 313 under a magnetic field.

Meanwhile, when the alignment-inducing layer 70 provided on the ultra-thin LED element is the charge layer 71, a charge layer having charges opposite to those of the charge layer 71, which is provided in the sub-pixel element, may be provided in the sub-pixel sites S1, S2, S3, and S4 on the first electrodes 311, 312, and 313, and thus, there is an advantage in that the ultra-thin LED elements may be more easily induced to an arrangement region and also more easily disposed upright. The charge layer is not limited when the charge layer is formed of a material suitable for forming a layer or a film while having positive charges or negative charges.

In addition, even when the alignment-inducing layer 70 provided on the ultra-thin LED element is the magnetic layer 73, a magnetic layer may be further included on the sub-pixel sites S1, S2, S3, and S4 on the first electrodes 311, 312, and 313, and thus, there is an advantage in that the ultra-thin LED elements may be more easily induced to the arrangement region and also more easily disposed upright. In this case, the magnetic layer may be a ferromagnetic material or a paramagnetic material.

Figure 6:
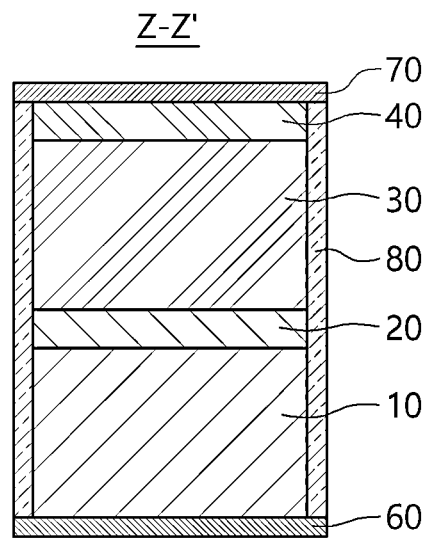
FIG. 6 is a cross-sectional view taken along boundary line Z-Z' of FIG. 5.

Meanwhile, although the alignment-inducing layer 70 is illustrated in FIGS. 5 and 6 as being positioned on the first electrode layer 40, the present disclosure is not limited thereto, and the alignment-inducing layer 70 may be disposed to be positioned on the second electrode layer 60. In other words, the alignment-inducing layer 70 may be provided on one side of the ultra-thin LED element in the thickness direction, that is, to be a top layer or a bottom layer of the ultra-thin LED element.

In addition, when a surface parallel to the stacking direction refers to a side surface, the ultra-thin LED element 101 may further include a protective film 80 surrounding the side surfaces of the element. The protective film 80 performs a function of protecting surfaces of the first conductive semiconductor layer 10, the photoactive layer 20, and the second conductive semiconductor layer 30. In addition, as in one manufacturing method of an ultra-thin LED element to be described below, in a process of etching an LED wafer in a thickness direction thereof and then separating a plurality of LED pillars, the protective film 80 may perform a function of protecting the first conductive semiconductor layer 10. The protective film 80 may include, for example, at least one selected from among silicon nitride ($Si_3N_4$), silicon dioxide ($SiO_2$), aluminum oxide ($Al_2O_3$), hafnium oxide ($HfO_2$), zirconium oxide ($ZrO_2$), yttrium oxide ($Y_2O_3$), titanium dioxide ($TiO_2$), aluminum nitride (AlN), and gallium nitride (GaN). The protective film 80 may have a thickness of 5 nm to 100 nm and more preferably a thickness of 30 nm to 100 nm, which may be advantageous in protecting the first conductive semiconductor layer 10 in a process of separating the LED pillars from the wafer of the manufacturing process of an ultra-thin LED element, which will be described below.

Figure 10:
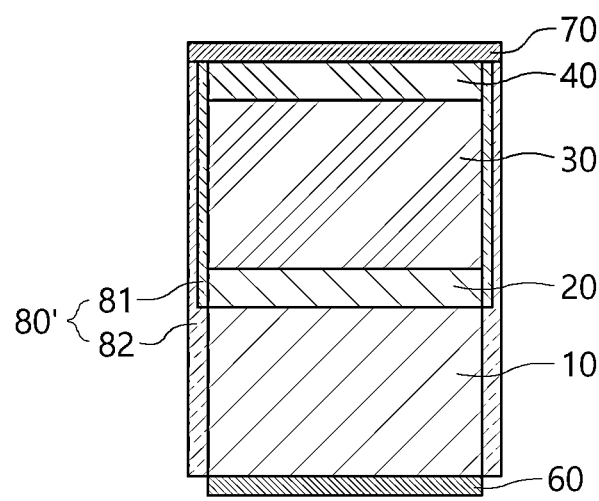
FIG. 10 is a cross-sectional view of an ultra-thin LED element used in one embodiment of the present disclosure.

Meanwhile, as shown in FIG. 10, an ultra-thin LED element 103 according to one embodiment of the present disclosure may include a protective film 80' that includes a hole pushing film 81 configured to surround exposed side surfaces of a second conductive semiconductor layer 30 or the exposed side surfaces of the second conductive semiconductor layer 30 and exposed side surfaces of at least a portion of a photoactive layer 20 to move holes at a surface side of the exposed side surface toward a center, and an electron pushing film 82 configured to surround exposed side surfaces of a first conductive semiconductor layer 10 to move electrons at a surface side of the exposed side surface toward a center in order to have a protection function as a protective film and also have more improved emission efficiency.

Some of the charges moving from the first conductive semiconductor layer 10 to the photoactive layer 20 and some of the holes moving from the second conductive semiconductor layer 30 to the photoactive layer 20 may move along a surface of a side surface, and in this case, quenching of electrons or holes may occur due to defects present on the surface, which may cause concerns that emission efficiency is degraded. In this case, even when a protective film is provided, there is a problem in that quenching is unavoidable due to defects occurring on an element surface before the protective film is provided. However, when the protective film 80' includes the hole pushing film 81 and the electron pushing film 82, electrons and holes may be concentrated toward an element center and guided to move in a direction of the photoactive layer, and thus, even when defects are present on the element surface before the protective film is formed, there is an advantage in that loss of emission efficiency due to surface defects may be prevented.

The hole pushing film 81 may include, for example, at least one selected from the group consisting of $AlN_x$, $ZrO_2$, $MoO$, $Sc_2O_3$, $La_2O_3$, $MgO$, $Y_2O_3$, $Al_2O_3$, $Ga_2O_3$, $TiO_2$, $ZnS$, $Ta_2O_5$, and $n\text{-}MoS_2$, and the electron pushing film 82 may include at least one selected from the group consisting of $Al_2O_3$, $HfO_2$, $SiN_x$, $SiO_2$, $ZrO_2$, $Sc_2O_3$, $AlN_x$, and $Ga_2O_3$.

In addition, as shown in FIG. 10, when the ultra-thin LED element includes both the hole pushing film 81 and the electron pushing film 82, the electron pushing film 82 may be provided as an outermost film surrounding side surfaces of the first conductive semiconductor layer 10, the photoactive layer 20, and the second conductive semiconductor layer 30.

Furthermore, the hole pushing film 81 and the electron pushing film 82 may each independently have a thickness of 1 nm to 50 nm.

Meanwhile, the first conductive semiconductor layer 10, the photoactive layer 20, and the second conductive semiconductor layer 30 of the ultra-thin LED element, which are described above, may be included as minimum components of the ultra-thin LED element, and another phosphor layer, a quantum dot layer, another active layer, a semiconductor layer, a hole blocking layer, and/or an electrode layer may be further included above/below each layer.

Further, according to one embodiment of the present disclosure, as shown in FIG. 2, a conductive metal layer 500 configured to connect the first electrodes 311, 312, and 313 and one side of the ultra-thin LED element 101 in contact with the first electrodes 311, 312, and 313 may be further included in order to reduce contact resistance between the first electrodes 311, 312, and 313 and the ultra-thin LED elements 101. The conductive metal layer 500 may be a conductive metal layer such as silver, aluminum, gold, or the like, and for example, may be formed to have a thickness of about 10 nm.

Further, an insulating layer 600 may further included in a space between the ultra-thin LED elements 101 disposed on the lower electrode line 310 and the upper electrode line 320 electrically in contact with the upper portion of the ultra-thin LED element 101. The insulating layer 600 prevents electrical contact between the two electrode lines 310 and 320 facing each other in a vertical direction, and serves to enable the upper electrode line 320 to be more easily implemented.

Further, as shown in FIG. 2, a color conversion layer 700 in which a blue color conversion layer 711, a green color conversion layer 712, and a red color conversion layer 713 are patterned is included on the upper electrode line 320 so that each of the plurality of sub-pixel sites becomes a sub-pixel site that independently expresses any one color among blue, green, and red. The blue color conversion layer 711, the green color conversion layer 712, and the red color conversion layer 713 may each be a known color conversion layer that converts light passing through the color conversion layer to have blue, green, and red colors in consideration of a wavelength of the light emitted by the ultra-thin LED element 101 provided in the sub-pixel site, and thus, the present disclosure is not particularly limited thereto. Meanwhile, when the ultra-thin LED element 101 is an element that emits blue light, the color conversion layer 700 may include a green color conversion layer and a red color conversion layer because the blue color conversion layer 711 is not required.

Further, a protective layer 800 configured to protect the color conversion layer 700 described above may be further provided, and a protective layer used in a conventional display in which the color conversion layer 700 is provided may be appropriately employed as the protective layer 800, and thus the present disclosure is not particularly limited thereto.

The above-described full-color LED display 1000 according to the first embodiment may be manufactured by a manufacturing method to be described below. Specifically, the full-color LED display 1000 may be manufactured by including operation (1) of preparing a lower electrode line including first electrodes in which a plurality of sub-pixel sites are formed, operation (2) of processing an ink composition including a plurality of ultra-thin LED elements, each of which includes a first conductive semiconductor layer, a photoactive layer, and a second conductive semiconductor layer, which are stacked, emits light of substantially the same color, and has a ratio, between a thickness in a stacking direction and a length of a major axis in a cross section perpendicular to the stacking direction, of 1:0.5 to 1.5, on the first electrodes so that at least two ultra-thin LED elements are disposed in each sub-pixel site, operation (3) of assembling the processed ultra-thin LED elements on the first electrodes to be upright in a thickness direction in the sub-pixel site, operation (4) of forming an upper electrode line including second electrodes to be electrically connected to a side opposite to one side of the ultra-thin LED element assembled on the first electrode, and operation (5) of patterning a color conversion layer on the upper electrode line so that the sub-pixel sites become sub-pixel sites each expressing any one of blue, green, and red colors in each of the plurality of sub-pixel sites. Hereinafter, the content of the full-color LED display 1000 described above will be omitted from the description of the manufacturing method.

First, as operation (1) according to the present disclosure, preparing a lower electrode line 310 including first electrodes 311, 312, and 313 in which a plurality of sub-pixel sites are formed is performed.

The first electrodes 311, 312, and 313 may be implemented in various electrode patterns known in the art, and the present disclosure is not particularly limited thereto. For example, as shown in FIG. 1, the plurality of first electrodes 311, 312, and 313 may be arranged in parallel to each other with a predetermined interval therebetween. The first electrodes 311, 312, and 313 may be formed on a substrate 400. As the substrate 400, for example, any one of a glass substrate, a quartz substrate, a sapphire substrate, a plastic substrate, and a flexible polymer film that is bendable may be used. As another example, the substrate 400 may be transparent. However, the substrate 400 is not limited to the listed types, and any type of substrate capable of forming an electrode may be used. An area of the substrate 400 is not limited, and may vary in consideration of an area of the first electrodes 311, 312, and 313 formed on the substrate 400. In addition, the substrate 400 may have a thickness of 100 μm to 1 mm, but the present disclosure is not limited thereto.

Next, as operation (2) according to the present disclosure, processing an ink composition including a plurality of ultra-thin LED elements 101, each of which includes a first conductive semiconductor layer 10, a photoactive layer 20, and a second conductive semiconductor layer 30, which are stacked, emits light of substantially the same color, and has a ratio, between a thickness in a stacking direction and a length of a major axis in a cross section perpendicular to the stacking direction, of 1:0.5 to 1.5, on the first electrodes 311, 312, and 313 so that at least two ultra-thin LED elements are disposed in each sub-pixel site is performed.

Figure 11:
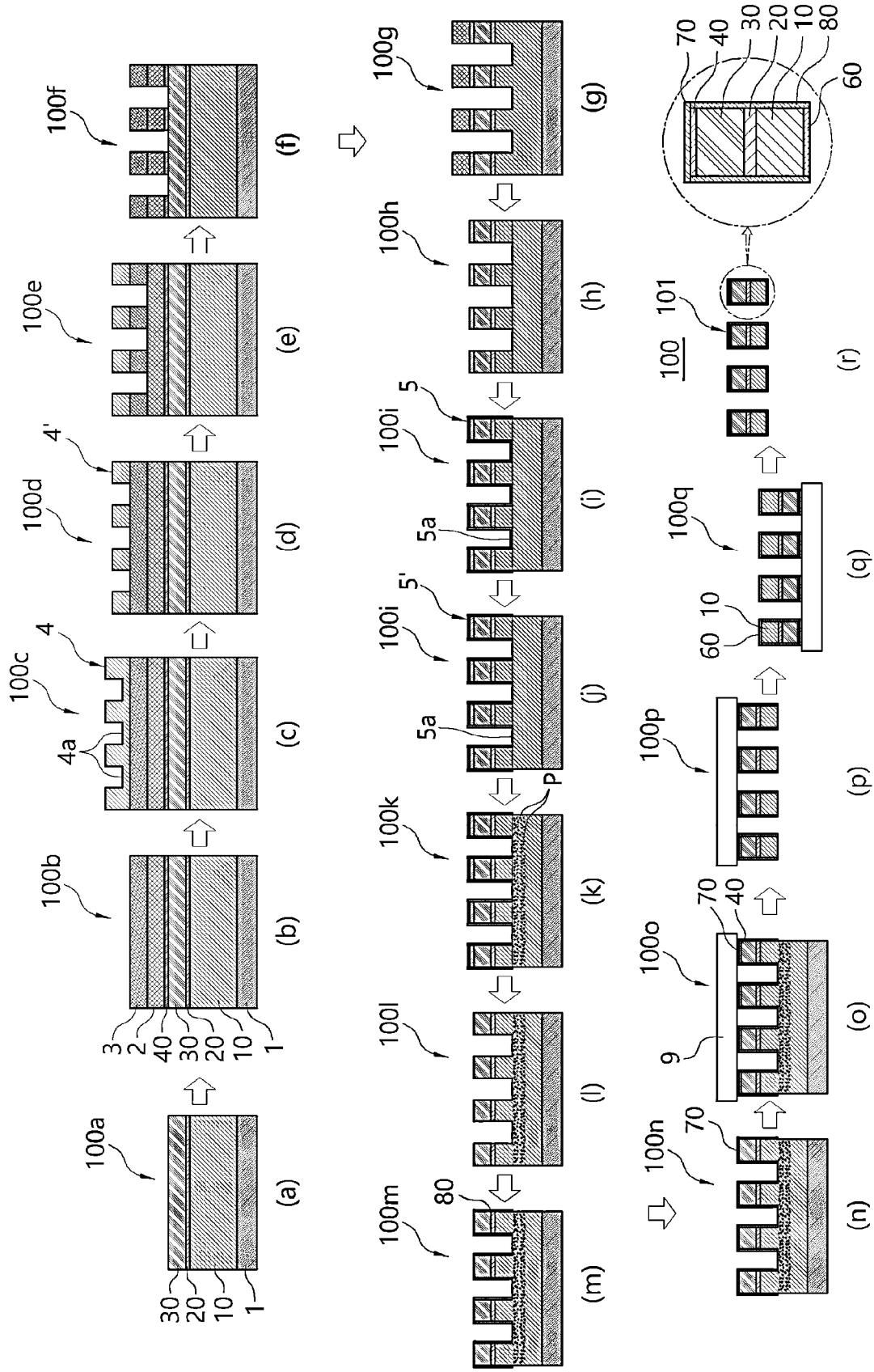
FIGS. 11 and 12 are schematic views illustrating Manufacturing Method 1 of an ultra-thin LED element used in one embodiment of the present disclosure.
Figure 12:
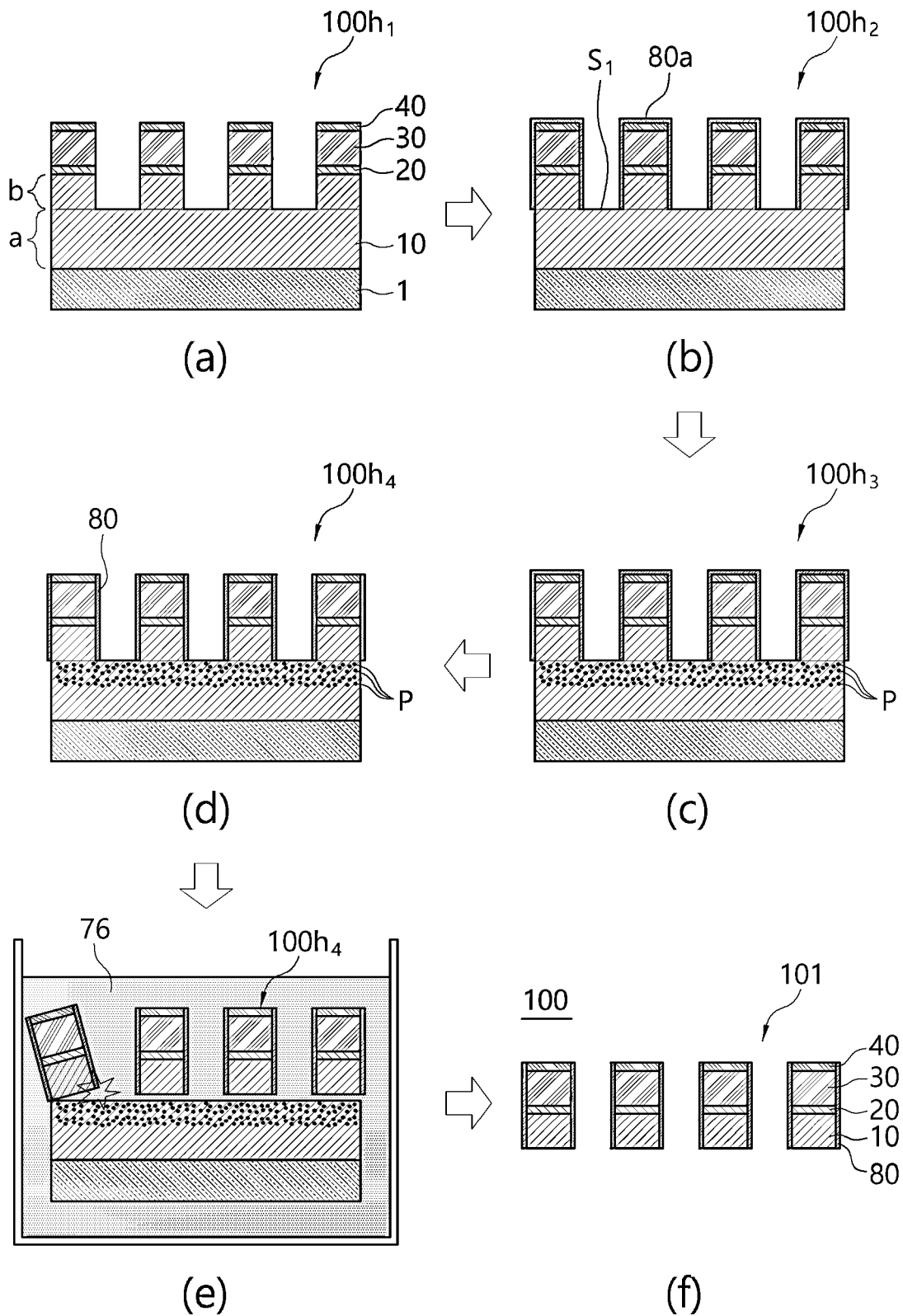
Figure 13:
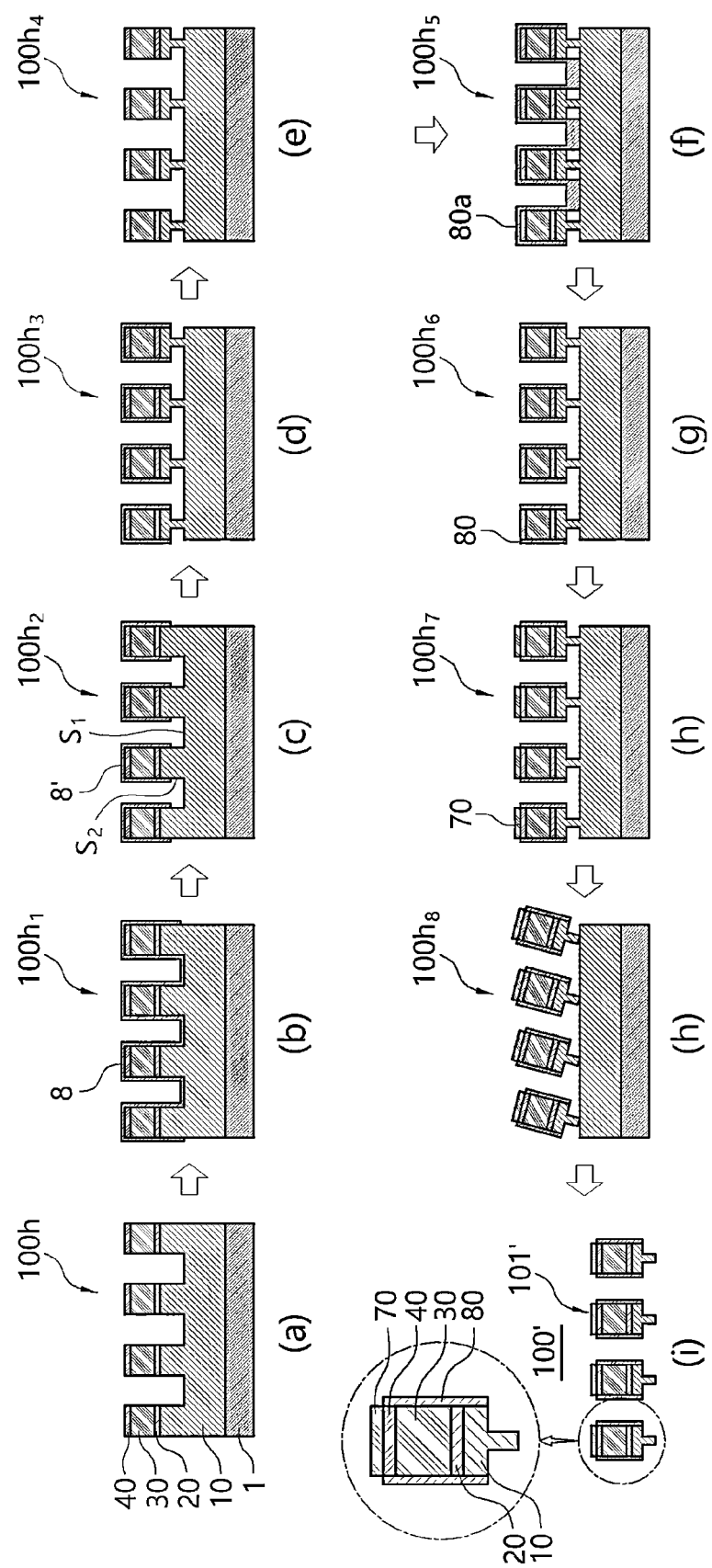
FIG. 13 is a set of schematic views illustrating Manufacturing Method 2 of an ultra-thin LED element used in one embodiment of the present disclosure.

The ultra-thin LED elements 10 are prepared as an ink composition in which a plurality of ultra-thin LED elements 10 are formed into ink, and an ultra-thin LED element aggregate 100 composed of the plurality of ultra-thin LED elements 101 may be manufactured through Manufacturing Method 1 shown in FIGS. 11 and 12 or Manufacturing Method 2 shown in FIG. 13. Manufacturing Method 1 may be usefully selected when an n-type III-nitride semiconductor layer is a doped n-type III-nitride semiconductor layer, and Manufacturing Method 2 may be useful when the n-type III-nitride semiconductor layer is an undoped n-type III-nitride semiconductor layer.

Manufacturing Method 1 and Manufacturing Method 2 have common processes up to a process of manufacturing a wafer (see 100h of FIG. 11 and 100h of FIG. 13) including a plurality of LED structures from an LED wafer 100a and differ in a method of separating the formed LED structures from the wafer. Processes up to the process of manufacturing the wafer (see 100h of FIG. 11 and 100h of FIG. 13) including the plurality of LED structures from the LED wafer 100a will be described through Manufacturing Method 1.

First, Manufacturing Method 1 will be described with reference to FIG. 11. Manufacturing Method 1 may include operation (A) of preparing an LED wafer 100a (see FIG. 11A), operation (B) of patterning an upper portion of the LED wafer 100a such that a planar surface perpendicular to a direction in which layers are stacked in each of LED structures has a desired shape and size (see FIGS. 11B and 11C), and then vertically etching a first conductive semiconductor layer 10 to at least a partial thickness thereof to form the plurality of LED structures (see FIGS. 11D to 11H), operation (C) of forming a protective film so as to surround an exposed surface of each of the plurality of LED structures and expose upper surfaces of first portions between the adjacent LED structures to the outside (see FIGS. 11I and 11J), operation (D) of immersing the LED wafer in an electrolyte, electrically connecting the LED wafer to one terminal of a power supply, electrically connecting the other electrode of the power supply to an electrode immersed in the electrolyte, and then applying power to form a plurality of pores in the first portions (see FIG. 11K), and operation (E) of applying ultrasonic waves to the LED wafer to separate the plurality of LED structures from the first portions in which the plurality of pores are formed (FIG. 11O).

A wafer that is commercialized and available may be used as the LED wafer 100a prepared in operation (A) without limitation. As an example, the LED wafer 100a may at least include a substrate 1, the first conductive semiconductor layer 10, a photoactive layer 20, and a second conductive semiconductor layer 30. In this case, the first conductive semiconductor layer 10 may be an n-type III-nitride semiconductor layer, and the second conductive semiconductor layer 30 may be a p-type III-nitride semiconductor layer. In addition, after the n-type III-nitride semiconductor layer is etched to a desired thickness, since the LED structures remaining on the LED wafer after the etching may be separated through operations (C) to (E), a thickness of the first conductive semiconductor layer 10, which is an n-type III-nitride semiconductor layer, in the LED wafer is also not limited, and the presence or absence of a separate sacrificial layer may not be considered when a wafer is selected.

In addition, each layer in the LED wafer 100a may have a c-plane crystal structure. In addition, the LED wafer 100a may be subjected to a cleaning process, and since a typical cleaning process and cleaning solution of a wafer may be appropriately applied in the cleaning process, the present disclosure is not particularly limited thereto. The cleaning solution may be, for example, at least one selected from among isopropyl alcohol, acetone, and hydrochloric acid, but the present disclosure is not limited thereto.

Next, before operation (B) is performed, an operation of forming the first electrode layer 40 on the second conductive semiconductor layer 30, which is a p-type III-nitride semiconductor layer, may be performed. The first electrode layer 40 may be formed through a typical method of forming an electrode on a semiconductor layer and may be formed by, for example, deposition through sputtering. The material of the first electrode layer 40 may be, for example, ITO as described above, and the first electrode layer 40 may be formed to have a thickness of about 150 nm. The first electrode layer 40 may be further subjected to a rapid thermal annealing process after a deposition process. As an example, the first electrode layer 40 may be processed at a temperature of 600° C. for 10 minutes. However, since the rapid thermal annealing process may be appropriately adjusted in consideration of the thickness and material of the electrode layer, the present disclosure is not particularly limited thereto.

Next, in operation (B), the upper portion of the LED wafer may be patterned such that the planar surface perpendicular to the direction in which the layers are stacked in the individual LED structure has a desired shape and size (see FIGS. 11B and 11C). Specifically, a mask pattern layer may be formed on an upper surface of the first electrode layer 40, and the mask pattern layer may be formed using a known method and material used in etching an LED wafer. A pattern of the pattern layer may be formed by appropriately applying a typical photolithography method or nanoimprinting method.

As an example, the mask pattern layer may be a stack of a first mask layer 2, a second mask layer 3, and a resin pattern layer 4', which form a predetermined pattern on the first electrode layer 40 as shown in FIG. 11F. When briefly describing a method of forming the mask pattern layer, as an example, the first mask layer 2 and the second mask layer 3 may be formed on the first electrode layer 40 through deposition, a resin layer 4, which is an origin of the resin pattern layer 4', may be formed on the second mask layer 3 (see FIGS. 11B and 11C), a residual resin portion 4a of the resin layer 4 may be removed through a typical method such as a reactive ion etching (RIE) method (see FIG. 11D), and then the second mask layer 3 and the first mask layer 2 may be sequentially etched (see FIGS. 11E and 11F) along a pattern of the resin pattern layer 4' to form the mask pattern layer. In this case, the first mask layer 2 may be made of, for example, silicon dioxide, and the second mask layer 3 may be a metal layer made of aluminum, nickel, or the like. The first mask layer 2 and the second mask layer 3 may be etched through an RIE method and an inductively coupled plasma (ICP) method. Meanwhile, when the first mask layer 2 is etched, the resin pattern layer 4' may also be removed (see 100f in FIG. 11).

Further, the resin layer 4, which is the origin of the resin pattern layer 4', may be formed through a nanoimprinting method. And, after manufacturing a mold corresponding to a desired predetermined pattern mold, the mold may be treated with a resin to form the resin layer, the resin layer may be transferred so as to be positioned on a wafer stack 100b in which the first mask layer 2 and the second mask layer 3 are formed on the first electrode layer 40, and then the mold may be removed to implement a wafer stack 100c on which the resin layer 4 is formed.

Meanwhile, although the method of forming a pattern through the nanoimprinting method has been described, the present disclosure is not limited thereto, and the pattern may also be formed through known photolithography using a photosensitive material or may be formed through known laser interference lithography, electron beam lithography, or the like.

Thereafter, as shown in FIG. 11G, the first conductive semiconductor layer 10, which is an n-type III-nitride semiconductor layer, may be vertically etched to a partial thickness in a direction perpendicular to a surface of an LED wafer 100f along a pattern of the mask pattern layers 2 and 3 formed on the first electrode layer 40, thereby forming an LED wafer 100g on which the LED structures are formed. In this case, the etching may be performed through typical dry etching such as ICP and KOH/TMAH wet etching. In such an etching process, the second mask layer 3 made of aluminum constituting the mask pattern layer may be removed, and then, the first mask layer 2, which is made of silicon dioxide constituting the mask pattern layer present on the first electrode layer 40 of each LED structure in the LED wafer 100g, may be removed to manufacture an LED wafer 100h on which the plurality of LED structures are formed.

Next, as operation (C), an operation of forming a protective film 80a so as to surround the exposed surfaces of each of the plurality of LED structures with a predetermined thickness in the LED wafer 100h on which the plurality of LED structures are formed and expose upper surfaces S1 of first portions a between the adjacent LED structures to the outside is performed (see FIGS. 11I and 11J). The protective film 80a is for preventing damage to the LED structure due to the performing of operation (D) to be described below. In addition, when the protective film 80a continues to remain on a side surface of the LED structure separated from the LED wafer, the protective film 80a may also perform a function of protecting a side surface of the individually separated LED structure from external stimuli.

Describing operations (C) to (E) with reference to FIG. 12, specifically, operation (C) may be performed by depositing a protective film material on the LED wafer 100h, on which the plurality of LED structures are formed, to form the protective film 80a so as to surround the exposed surfaces of each of the plurality of LED structures (operation C-1) with a predetermined thickness and removing the protective film deposited on the upper surfaces S1 of the first portions a between the adjacent LED structures to expose the upper surfaces S1 of the first portions a between the LED structures to the outside (operation C-2).

Operation C-1 is an operation of depositing the protective film material on the LED wafer 100h on which the plurality of LED structures are formed (see FIG. 12A). In this case, the protective film material may be a known material that is not chemically damaged by the electrolyte in operation (D) to be described below. As an example, the above-described material of the protective film 80 may be used without limitation, and for example, the protective film material may include at least one selected from among silicon nitride ($Si_3N_4$), silicon dioxide ($SiO_2$), aluminum oxide ($Al_2O_3$), hafnium oxide ($HfO_2$), zirconium oxide ($ZrO_2$), yttrium oxide ($Y_2O_3$), lanthanum oxide ($La_2O_3$), scandium oxide ($Sc_2O_3$), titanium dioxide ($TiO_2$), aluminum nitride (AlN), and gallium nitride (GaN). In addition, the protective film 80a formed by depositing the protective film material may have a thickness of 5 nm to 100 nm and more preferably a thickness of 30 nm to 100 nm. When the thickness of the protective film 80a is less than 5 nm, it may be difficult to prevent the LED structure from being damaged by the electrolyte in operation (D) to be described below, and when the thickness of the protective film 80a exceeds 100 nm, there may be problems in that manufacturing costs are increased and the LED structures are connected.

Next, operation C-2 is an operation of removing the protective film deposited on the upper surfaces S1 of the first portions a between the adjacent LED structures to expose the upper surfaces S1 of the first portions a between the LED structures to the outside (see FIG. 12B). Due to the performing of operation C-1, the protective film material is also deposited on the upper surfaces S1 of the first portions a between the adjacent LED structures, and thus, since the electrolyte may not come into contact with the first conductive semiconductor layer 10 that is the n-type III-nitride semiconductor, desired pores may not be formed in the first portions a. Thus, an operation of removing the protective film material applied on the upper surface S1 of the first portion a to expose the upper surface S1 of the first portion a to the outside may be performed, and in this case, the removing of the protective film material may be performed through a known dry or wet etching method in consideration of the protective film material.

Meanwhile, according to one embodiment of the present disclosure, the protective film 80a formed in operation (C) may be a temporary protective film for preventing damage to the LED structure due to the performing of operation (C), and an operation of forming a surface protective film surrounding the side surfaces of the LED structure after the temporary protective film is removed may be further included between operation (D) and operation (E). That is, as shown in FIG. 11, a protective film 5' in operation (C) may be provided only as a temporary protective film for preventing damage to the LED structure in operation (D) (see FIGS. 11I to 11K), a surface protective film 80, which performs a function of preventing damage to the surface of the LED structure after the temporary protective film is removed, may be formed to cover the side surface of the LED structure before operation (E) is performed (see FIG. 11M).

Meanwhile, in some embodiments, as shown in FIG. 11, there is an inconvenience in that the protective film is formed twice, but the protective film may be selected in consideration of the planar shape and size of the LED structures to be manufactured, and the interval between the LED structures. In addition, when operation (D) to be described below is performed, the protective film may be partially damaged, and since there may be a case in which, when the damaged protective film is left on the finally obtained individual LED structure and used as a surface protective film, it is difficult for the damaged protection film to properly perform a surface protection function, in some cases, it may be advantageous to remove a protective film subjected to operation (D) and then provide a protective film again.

When describing such manufacturing processes shown in FIG. 11, after a temporary protective film material 5 is deposited on the LED wafer 100$h$ on which the plurality of LED structures are formed (see FIG. 11I), the temporary protective film material 5, which is deposited on the upper surfaces S1 of the first portions a of the first conductive semiconductor layer 10, which is a doped n-type III-nitride semiconductor layer, between adjacent LED structures of an LED wafer 100$i$ on which the protective film 5 is deposited, may be etched to form the protective film 5' which is a temporary protective film that protects the side surfaces and upper portions of the plurality of LED structures. Next, after operation (D) to be described below is performed (see FIG. 11K), the protective film 5' may be removed through etching (see FIG. 11L), a protective film material may be deposited on the LED wafer 100$l$ as a surface protective film for protecting the surface of the LED structure, and then, the protective film material formed on each of the LED structures may be removed to form the protective film 80 surrounding the side surfaces of the LED structure (see FIG. 11M). In this case, the protective film material formed on the LED structures may be removed together with the protective film material deposited on the upper surfaces S1 of the first portions a of the first conductive semiconductor layer 10, which is a doped n-type III-nitride semiconductor layer, between adjacent LED structures of an LED wafer 100$m$. Thus, in operation (E) to be described below, a bubble-forming solution may come into contact with the upper surfaces S1 of the first portions a, and bubbles generated through ultrasonic waves may penetrate into pores P formed in the first portions a so that the LED structures may be separated through the bubbles.

Meanwhile, descriptions of the temporary protective film material and the surface protective film material are the same as those of the material of the above-described protective film, and an implemented film thickness may also be implemented within a thickness range of the above-described protective film.

Next, as operation (D) of Manufacturing Method 1, an operation of immersing the LED wafer in the electrolyte, electrically connecting the LED wafer to one terminal of the power supply, electrically connecting the other electrode of the power supply to the electrode immersed in the electrolyte, and then applying power to form the plurality of pores in the first portions is performed.

Specifically, referring to FIG. 12, an LED wafer 100$h_2$ on which the protective film 80$a$ is formed may be electrically connected to one terminal of the power supply, for example, an anode, and the other terminal of the power supply, for example, a cathode, may be electrically connected to the electrode immersed in the electrolyte, and then, power may be applied, thereby manufacturing an LED wafer 100$h_3$ in which the plurality of pores P are formed in the first portions a of the first conductive semiconductor layer 10 which is a doped n-type III-nitride semiconductor. In this case, the pores P may start to be formed from the upper surface S1 of the first portions a of the first conductive semiconductor layer 10, which is the doped n-type III-nitride semiconductor, in direct contact with the electrolyte, and may be formed in a thickness direction and a direction toward a side surface of the first portion a corresponding to a lower portion of each of the LED structures.

The electrolyte used in operation (D) may include at least one oxyacid selected from the group consisting of oxalic acid, phosphoric acid, sulfurous acid, sulfuric acid, carbonic acid, acetic acid, chlorous acid, chloric acid, bromic acid, nitrous acid, and nitric acid, and more preferably, oxalic acid may be used. Through this, there is an advantage in that damage to the first conductive semiconductor layer may be minimized. In addition, the electrode may be made of platinum (Pt), carbon (C), nickel (Ni), gold (Au), or the like and may be, for example, a platinum electrode. In addition, in operation (D), a voltage of 3 V or more may be applied as power for 1 minute to 24 hours, and thus, the pores P may be smoothly formed up to the first portion a corresponding to the lower portion of each of the plurality of LED structures. Accordingly, the LED structure may be more easily separated from the wafer through operation (E). More preferably, a voltage of 10 V or more may be applied, and more preferably, a voltage of 30 V or less may be applied. When a voltage of less than 3 V is applied, even when an application time of power is increased, pores may not be smoothly formed in the first portion a corresponding to the lower portion of each of the LED structures, and thus, it may be difficult to separate the LED structures through operation (E) to be described below, or even though the LED structures are separated, separated cross sections of the plurality of LED structures may have different shapes, which may make it difficult for the plurality of LED structures to exhibit uniform characteristics. In addition, when a voltage exceeding 30 V is applied, pores may be formed up to a second portion b which is a lower end portion of the LED structure connected to the first portion a of the doped n-type III-nitride semiconductor layer, thereby causing the deterioration of emission properties. In addition, it is preferable that the separation of the LED structure in operation (E) to be described below is performed at a boundary point between the first portion a of the doped n-type III-nitride semiconductor layer and the second portion b, but due to pores formed in the second portion b, separation may occur at any point of the second portion b beyond the boundary point, which may cause a risk of obtaining an LED structure including an n-type semiconductor layer with a thickness less than that of an initially designed n-type semiconductor layer. In addition, similarly to an effect according to a strength of a voltage, when an application time of power is increased, pores are likely to be formed in the second portion b other than a desired portion, and conversely, when the application time is decreased, pores may not be smoothly formed, and thus, it may be difficult to separate the LED structures.

After operation (D) and before operation (E) to be described below, an operation of manufacturing an LED wafer 100$h_4$, in which the protective film formed on an upper surface of each of the LED structures among the protective film 80$a$ is removed to enable an electrical connection to the first electrode layer 40 after the LED structure is separated from a wafer, may be further performed. In addition, since only the protective film formed on the upper surface of the LED structure is removed, the protective film 80 formed on the side surface of the LED structure may remain to perform a function of protecting the side surface of the LED structure from the outside.

In addition, after operation (D) and before operation (E) to be described below, an operation of forming another layer on the first electrode layer 40 of the LED structure may be further performed, and the other layer may be, for example, a Ti/Au composite layer that may be further formed on the first electrode layer 40, which is an ITO layer, with a first electrode layer material, or the alignment-inducing layer 70 (see FIG. 11N).

Next, as operation (E) according to Manufacturing Method 1, an operation of applying ultrasonic waves to the LED wafer $100h_4$ to separate the plurality of LED structures from the first portions a in which the plurality of pores P are formed is performed. In this case, the ultrasonic waves may be applied directly to the LED wafer $100h_4$ in which the pores are formed or may be applied indirectly by immersing the LED wafer $100h_4$, in which the pores are formed, in a solvent. However, in a method of collapsing the pores P of the first portion a using a physical external force caused by the ultrasonic wave itself, the collapse of the pores is not smooth, and when the pores are excessively formed to facilitate the collapse, the pores are likely to be formed up to the second portion b of the LED structure, which may cause a side effect of reducing the quality of the LED structure.

Accordingly, according to one embodiment of the present disclosure, operation (E) may be performed using a sonochemical method. Specifically, after the LED wafer $100h_4$ is immersed in a bubble-forming solution (or solvent) 76, ultrasonic waves are applied to the bubble-forming solution (or solvent) 76 to collapse the pores through energy generated when bubbles generated and grown through a sonochemical mechanism burst in the pores, thereby separating the plurality of LED structures. Specifically, ultrasonic waves alternately generate a relatively high pressure portion and a relatively low pressure portion in a traveling direction of a sound wave. In this case, generated bubbles pass through the high pressure portion and the low pressure portion and repeatedly contract and expand to grow into bubbles with a higher temperature and high pressure and then collapse, and when the bubbles collapse, as an example, the bubbles become local hot spots that generate a high temperature of 4,000 K and a high pressure of 1,000 atm. Therefore, by using such energy, the pores generated in the LED wafer may be collapsed to separate the LED structure from the wafer. After all, the ultrasonic wave only performs a function of generating and growing bubbles in the bubble-forming solution (or solvent) and moving and penetrating the generated bubbles into the pores P of the first portion a. Then, through a pore collapse mechanism in which the pores P are collapsed by an external force generated at the time of the bursting of the bubbles in an unstable state with a high temperature and high pressure, which have penetrated into the pores P, the plurality of LED structures may be easily separated from the LED wafer, thereby obtaining an LED aggregate 100' including a plurality of ultra-thin LED elements 101'.

A solution (or solvent) capable of generating bubbles when ultrasonic waves are applied and growing to have a high pressure and temperature may be used as the bubble-forming solution (or solvent) 76 without limitation, and preferably, the bubble-forming solution (or solvent) may have a vapor pressure of 100 mmHg or less (at 20° C.), for example, a vapor pressure of 80 mmHg or less (at 20° C.), a vapor pressure of 60 mmHg or less (at 20° C.), a vapor pressure of 50 mmHg or less (at 20° C.), a vapor pressure of 40 mmHg or less (at 20° C.), a vapor pressure of 30 mmHg or less (at 20° C.), a vapor pressure of 20 mmHg or less (at 20° C.), or a vapor pressure of 10 mmHg or less (at 20° C.). When a solvent having a vapor pressure exceeding 100 mmHg (at 20° C.) is used, separation may not occur properly within a short time, which may cause concerns that a manufacturing time is increased and production costs are increased. The bubble-forming solution (or solvent) 76 satisfying such physical properties may include, for example, at least one selected from the group consisting of gamma-butyllactone, propylene glycol methyl ether acetate, methyl pyrrolidone, and 2-methoxyethanol. Meanwhile, a solution (or solvent) having a vapor pressure of 100 mmHg at room temperature, for example, 20° C., may be used as the bubble-forming solution (or solvent), but alternatively, by adjusting conditions for performing operation (E), operation (E) may be performed by adjusting a vapor pressure of the bubble-forming solution (or solvent) so as to be 100 mmHg or less under the above conditions (for example, low temperature conditions). In this case, restrictions on types of usable solvents may be wider, and as an example, solvents such as water, acetone, chloroform, and alcohols may be used.

In addition, a wavelength of an ultrasonic wave applied in operation (E) may be in a range capable of causing a sonochemical effect, and specifically, the ultrasonic wave may be applied at a frequency capable of growing and collapsing bubbles so as to become local hot spots that generate a high pressure and temperature when the bubbles are collapsed. As an example, the frequency may be in a range of 10 kHz to 2 MHz, and an application time of the applied ultrasonic wave may be in a range of 1 minute to 24 hours, thereby making it easy to separate the LED structure from the LED wafer. Even when a wavelength of an applied ultrasonic wave falls within the range, when an intensity of the applied ultrasonic wave is low or an application time thereof is short, there is a risk that there are LED structures that are not separated from the LED wafer or the number of the LED structures that are not separated from the LED wafer is increased. In addition, when the intensity of the applied ultrasonic wave is high or the application time is long, the LED structure may be damaged.

Meanwhile, in order to form a second electrode layer 60 on the first conductive semiconductor layer 10, before operation (E) described above is performed, an operation of attaching a support film 9 onto an LED wafer 100n to form another layer, for example, the second electrode layer 60 or an electron delay layer (not shown), on the first conductive semiconductor layer 10 may be further performed (see FIG. 11O), and then, operation (E) may be performed to separate the plurality of LED structures in a state in which the support film 9 is attached (see FIG. 11P). After that, in a state in which the support film 9 is attached, the second electrode layer 60 may be formed on the plurality of LED structures through a known method such as a deposition method (FIG. 11Q), and then, the support film may be removed, thereby obtaining an aggregate 100 of a plurality of ultra-thin LED elements 101.

Next, a method of manufacturing an ultra-thin LED element through Manufacturing Method 2 will be described with reference to FIG. 13.

As described above, an LED wafer $100h$ on which a plurality of LED structures are formed from an LED wafer is the same as in Manufacturing Method 1. Thereafter, the LED wafer $100h$ on which the plurality of LED structures are formed may be processed by operation (i) of forming an insulating film 8 so as to cover exposed side surfaces of the plurality of LED structures (see FIG. 13B), operation (ii) of removing portions of the insulating film formed on a first conductive semiconductor layer 10 to expose upper surfaces Si of the first conductive semiconductor layer 10 between adjacent LED structures (see FIG. 13C), operation iii) of further etching the first conductive semiconductor layer 10 in a thickness direction thereof through the exposed upper surfaces S1 of the first conductive semiconductor layer to form portions of the first conductive semiconductor layer, of which a side surface is exposed by a predetermined thickness in a downward direction of the first conductive semiconductor layer of an LED pillar, on which an insulating film 8' is formed (see FIG. 13C), operation (iv) of etching the portions of the first conductive semiconductor layer, of which the side surface is exposed, in a direction from both side surfaces to a center thereof (see FIG. 13D), operation (v) of removing the insulating film 8 (see FIG. 13E), operation (vi) of forming a protective film 80 on side surfaces of the plurality of LED structures (see of FIG. 13F), operation (vii) of removing the protective film formed on the plurality of LED structures to expose a first electrode layer 40 (see FIG. 13G), operation (viii) of forming an alignment-inducing layer 70 on the first electrode layer 40 (see FIG. 13H), and operation (ix) of separating the plurality of LED structures from the LED wafer, thereby manufacturing an ultra-thin LED aggregate 100' including a plurality of ultra-thin LED elements 101'. Meanwhile, Manufacturing Method 2 described above may be performed by appropriately using a known method of manufacturing an LED element, and for detailed descriptions thereof, Korean Patent Application No. 2020-0050884 disclosed by the inventors of the present disclosure is incorporated by reference in its entirety and detailed descriptions of each operation of Manufacturing Method 2 of the present disclosure will be omitted.

In this case, the separating of the plurality of LED structures in operation (ix) may be cutting using a cutting mechanism or detaching using an adhesive film.

Figure 14:
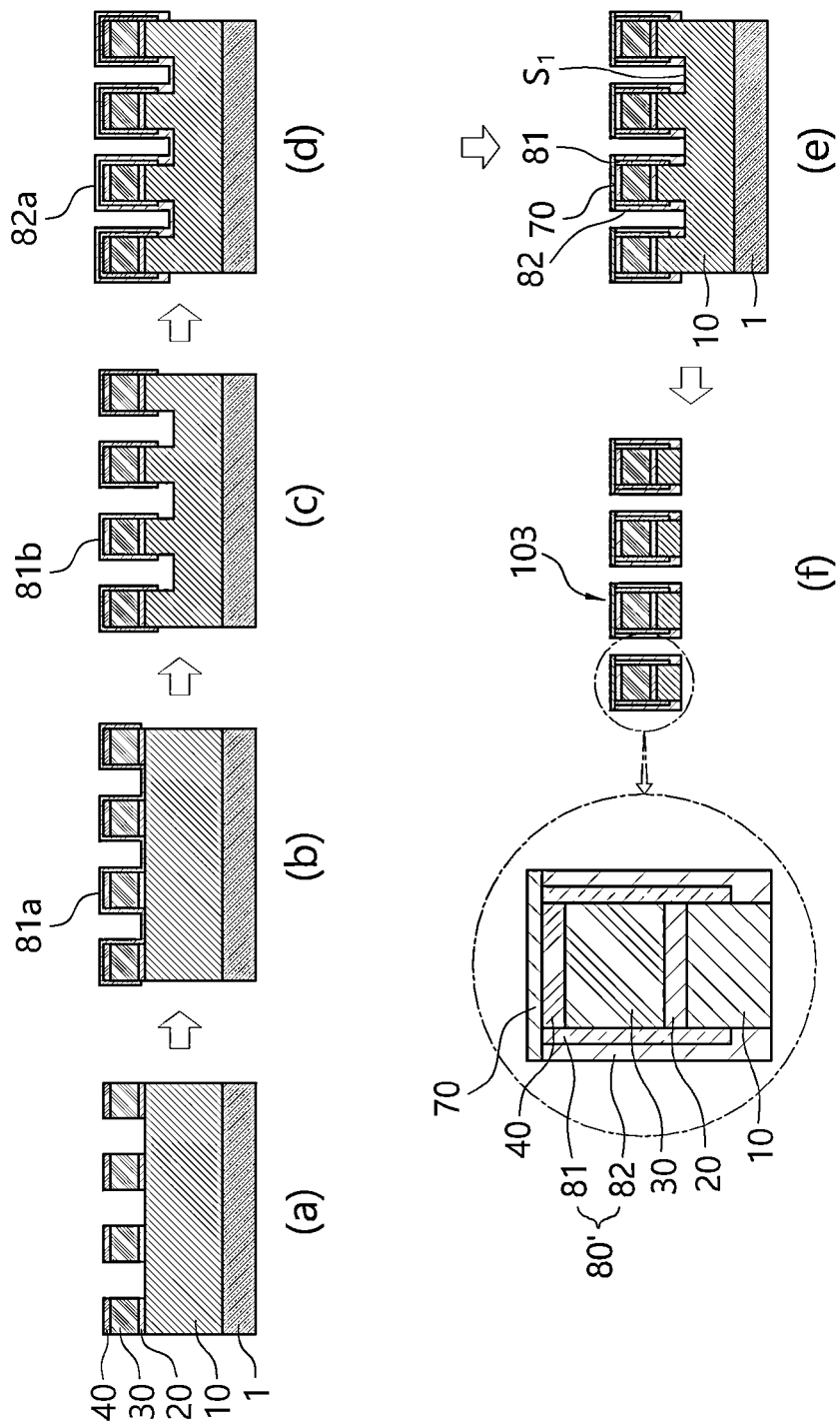
FIG. 14 is a set of schematic views illustrating one manufacturing method of an ultra-thin LED element used in one embodiment of the present disclosure.

Meanwhile, as described above with reference to FIG. 10, a protective film 80' including a hole pushing film 81 and an electron pushing film 82 for improving emission efficiency as a protective film may be formed, and a manufacturing method thereof will be described with reference to FIG. 14.

There is a difference from those described above with reference to FIGS. 11 to 13 in that processes of, during vertical etching, without performing etching up to a portion of a first conductive semiconductor layer 10 which is an n-type semiconductor, primarily etching only a second conductive semiconductor layer 30, up to a portion of a photoactive layer 20, or up to the photoactive layer 20 (see FIG. 14A), secondarily etching the first conductive semiconductor layer 10 to a partial thickness thereof (see FIG. 14C), depositing a film material, and removing the film material between a plurality of LED structures are performed twice (see FIGS. 14B, 14D, and 14E).

Specifically, processes of, when an LED wafer is vertically etched, without performing etching up to a portion of the first conductive semiconductor layer 10, which is an n-type semiconductor, primarily etching only the second conductive semiconductor layer 30, up to portions of the second conductive semiconductor layer 30 and the photoactive layer 20, or up to the photoactive layer 20 (see FIG. 14A), depositing a hole pushing film material 81a (see FIG. 14B), and then, removing a hole pushing film material formed between the LED structures are performed. After that, processes of secondarily etching the first conductive semiconductor layer 10 again to a predetermined thickness thereof (see FIG. 14C), depositing an electron pushing film material 82a on the LED structure on which a hole pushing film 81b is formed (see FIG. 14D), and then, removing the electron pushing film material formed on an upper surface S1 of the first conductive semiconductor layer 10 between the LED structures again (FIG. 14E) may be performed. Thereafter, a process of separating the LED structure as described above with reference to FIGS. 11 and 12 (see FIG. 11K and the drawings subsequent thereto and see FIG. 12C and the drawings subsequent thereto), or a process of separating the LED structure in FIG. 13 (see FIG. 13D and the drawings subsequent thereto) may be performed to separate an ultra-thin LED element 103 from the LED wafer.

The ultra-thin LED elements 101, 102, and 103 obtained through the above-described methods may be implemented as an ink composition. The ink composition may further include a dispersion medium and other additives which are provided in a known ink composition for an inkjet, and the present disclosure is not particularly limited thereto. However, as described above, in the ultra-thin LED element 101, since the thickness and length of the major axis of a cross section perpendicular to the stacking direction satisfy the specific ratio described above, there is an advantage in that the precipitation is delayed during ink formation and a dispersed state may be maintained for a long time. In addition, the concentration of the ultra-thin LED element 101 dispersed in the ink composition and the viscosity of the ink composition may be designed to be suitable for an inkjet printing device configured to print the ink composition, and the present disclosure is not particularly limited thereto. In addition, the inkjet printing device is a device capable of printing an ink composition containing ultra-thin LED elements on the first electrode, and may be a device employing a known method such as a piezoelectric method or an electrostatic method. In the present disclosure, an inkjet printing device and a specific method of performing printing on the first electrode using the same are not particularly limited.

Next, as operation (3) according to the present disclosure, assembling the processed ultra-thin LED elements 101, for example, printed through the inkjet printing device, on the first electrodes 311, 312, and 313 to be upright in the thickness direction in the sub-pixel sites S1, S2, S3, and S4 is performed.

Even though the plurality of ultra-thin LED elements 101 dispersed in the ink composition are printed so that at least two are provided in each of the sub-pixel sites S1, S2, S3, and S4, some of the ultra-thin LED elements 101 may be located outside the sub-pixel sites S1, S2, S3, and S4. In addition, even when the ultra-thin LED elements 101, 102, or 103 are located in the sub-pixel sites S1, S2, S3, and S4, all ultra-thin LED elements 101 may not be disposed upright in the thickness direction on the first electrodes 311, 312, and 313.

Thus, in the full-color LED display 1000, as described above, the alignment-inducing layer 70 for inducing the ultra-thin LED elements 101 to move into the sub-pixel sites S1, S2, S3, and S4 and arranging the ultra-thin LED elements upright on the first electrodes 311, 312, and 313 in the thickness direction may be further formed on one side of the ultra-thin LED element 101 and on one side or both sides of the sub-pixel sites S1, S2, S3, and S4 in the first electrodes 311, 312, and 313.

Figure 15:
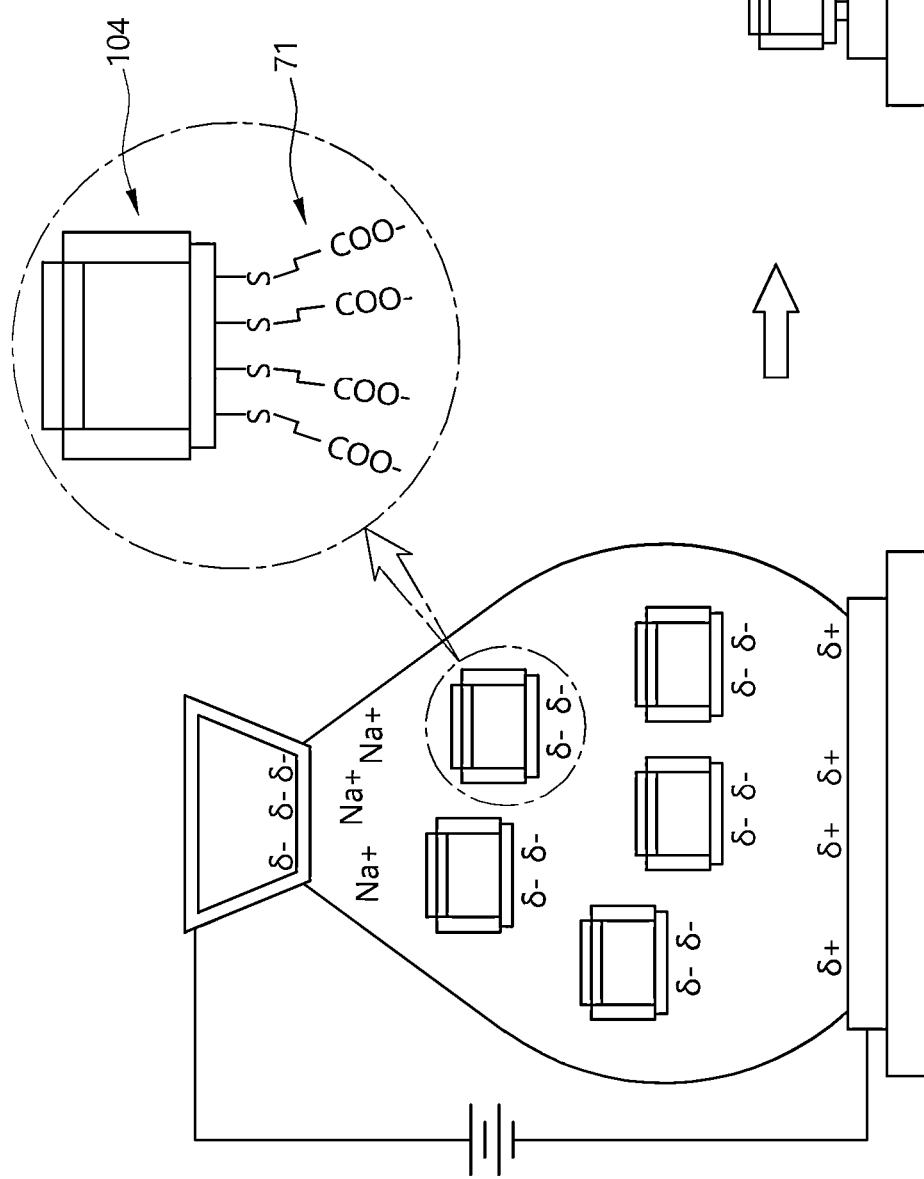
FIGS. 15 to 17 are schematic views illustrating various embodiments of one operation of a manufacturing method of an ultra-thin LED display according to one embodiment of the present disclosure.

Specifically, when describing with reference to FIG. 15, when the alignment-inducing layer 70 is a charge layer 71 having positive or negative charges, after or together with or before printing an ink composition containing the ultra-thin LED elements, an electric field may be formed in a direction perpendicular to the main surface of the first electrode 311 through an electrophoresis method so that ultra-thin LED elements 104 are moved to the arrangement region and disposed upright in the thickness direction. In addition, when the charge layer provided in the ultra-thin LED element is a first charge layer having positive charges or negative charges so that the ultra-thin LED elements are advantageously moved and disposed upright in the arrangement region, a second charge layer having charges opposite to those of the first charge layer may be further provided in the arrangement region on the first electrode. Each of the first charge layer and the second charge layer may have a thickness of, for example, 0.1 nm to 500 nm, but the present disclosure is not particularly limited thereto since the thickness is not limited when the charge layers have charges.

In addition, since the strength of the electric field for moving the ultra-thin LED elements into the arrangement region and disposing the ultra-thin LED elements upright through the electrophoresis method may also be appropriately changed in consideration of the number, size, and the like of the ultra-thin LED element in the ink composition, the present disclosure is not particularly limited thereto.

Figure 16:
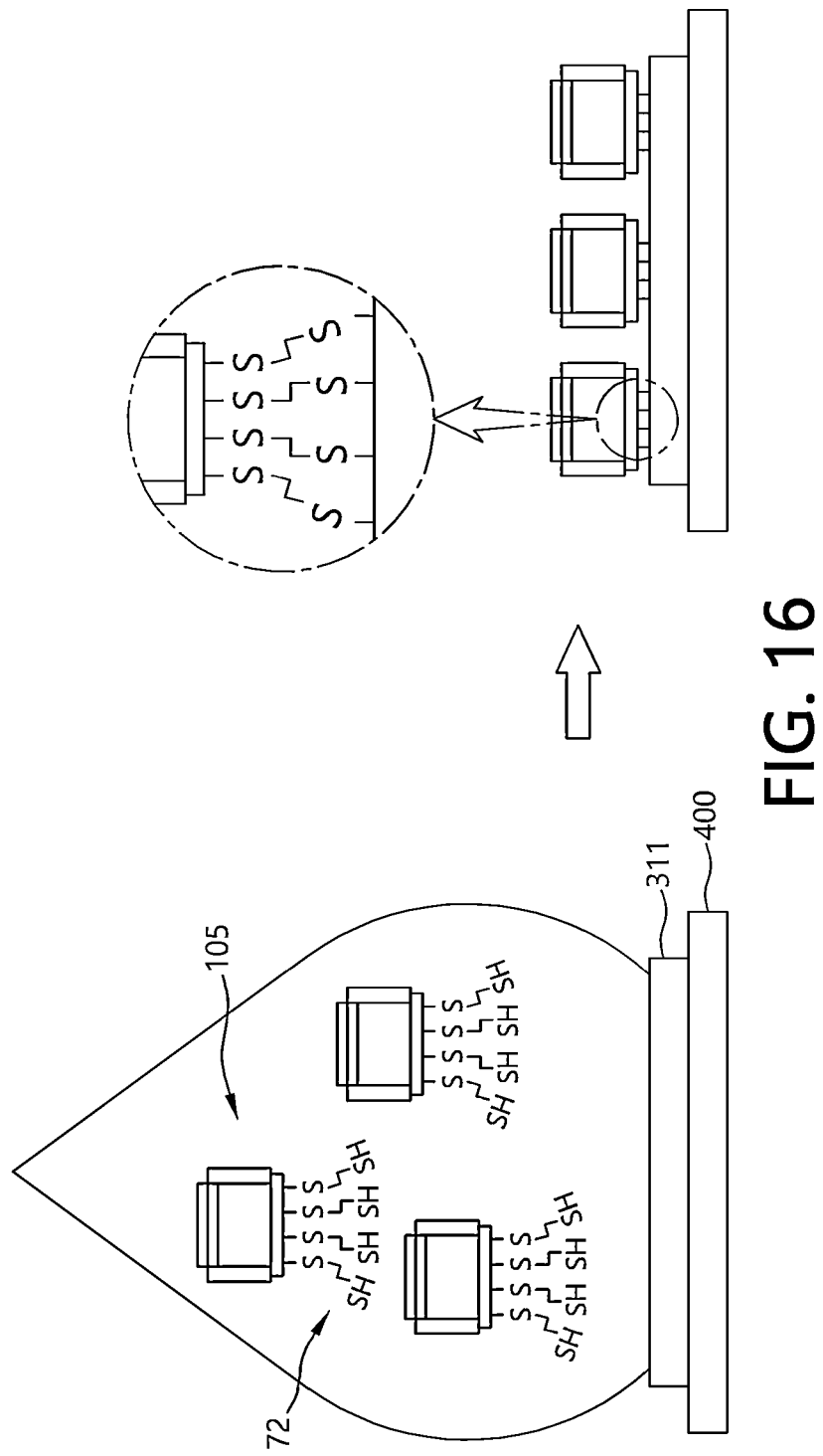

Alternatively, when a case in which the alignment-inducing layer 70 is a bonding layer 72 is described with reference to FIG. 16, ultra-thin LED elements 105 may be assembled upright in the arrangement region through chemical bonding through the bonding layer 72. In this case, the bonding layer 72 may be provided on one side of the ultra-thin LED element 105 in the thickness direction and/or in the arrangement region. For example, the bonding layer may be formed such that, for example, a thiol group, an amine group, a carboxyl group, single strand DNA or the like may be exposed to the outside, and specifically, the bonding layer may be formed through a compound such as aminoethanethol, 1,2-ethanedithiol, 1,4-butanedithiol, 3-mercaptopropionic acid, $NH_2$-terminated single-stranded DNA, or the like. In addition, the chemical bond may be a covalent bond or a non-covalent bond, and for example, in a case of the bonding layer in which a thiol group is exposed to the outside, the bonding layer may be bonded to the first electrode, which is metal, through a non-covalent bond. In addition, since a reaction rate is low when an amide bond is formed by bonding an amine group with a carboxyl group, 1-ethyl-3-(3'-dimethylaminopropyl)carbodiimide (EDC) may be added to form an active ester intermediate of the carboxyl group, followed by addition of a strong nucleophilic primary amine, thereby rapidly forming the amide bond. In addition, in order to stabilize the ester intermediate using EDC, sulfo N-Hydroxysuccinimide (NHS) may be used so that the amide bond may be stably achieved. In addition, the bonding layer may include a first bonding layer formed on a side of the ultra-thin LED element and a second bonding layer formed on a side of the first electrode, and the ultra-thin LED elements may be assembled upright on the first electrode through a complementary bond between a first linker in the first bonding layer and a second linker in the second bonding layer.

Figure 17:
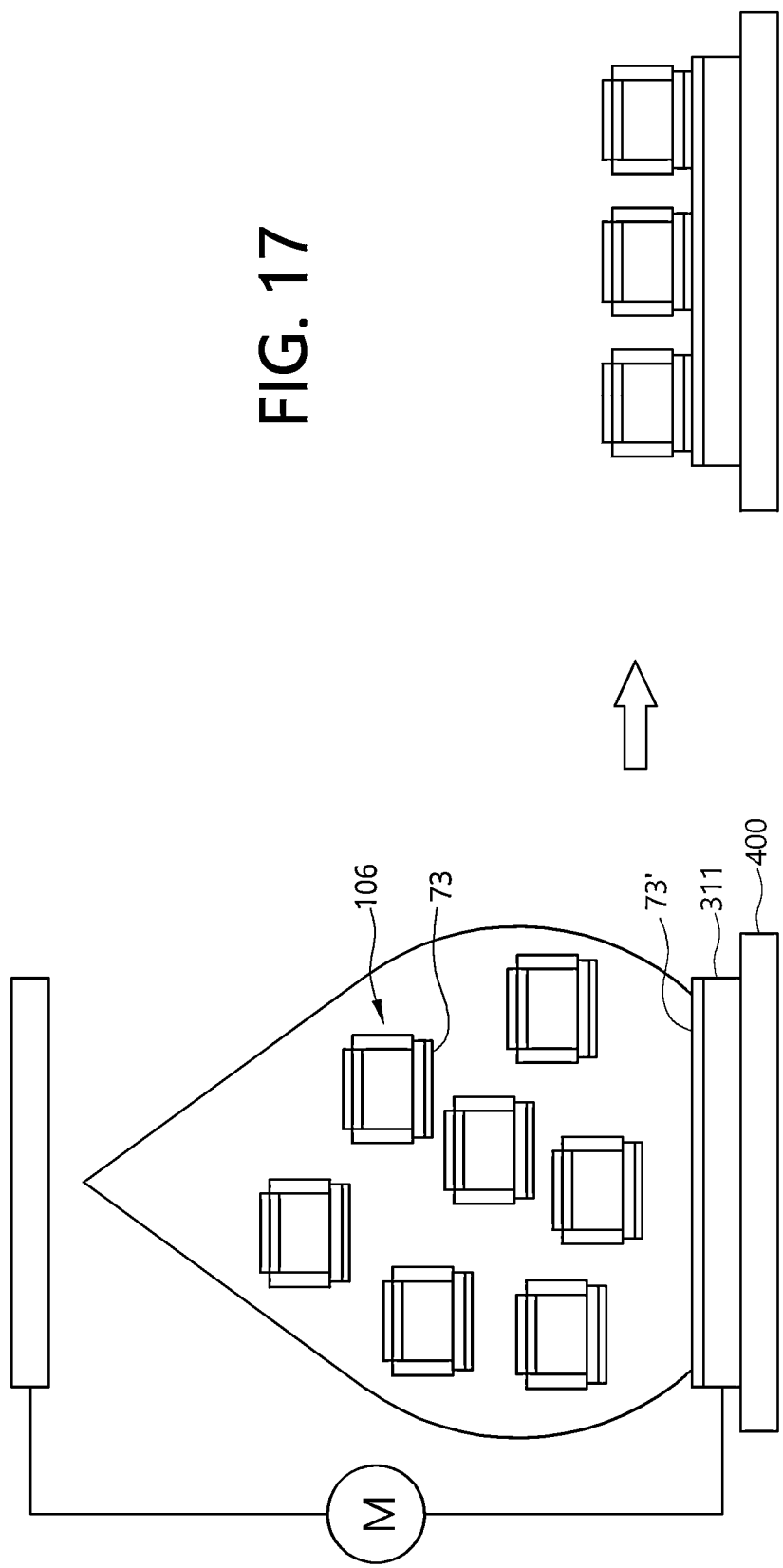

Alternatively, when a case in which the alignment-inducing layer 70 is a magnetic layer 73 is described with reference to FIG. 17, after or together with or before printing an ink composition containing ultra-thin LED elements so that ultra-thin LED elements 106 are moved to the arrangement region and disposed upright in the thickness direction through a magnetic force, a magnetic field may be formed in a direction perpendicular to the main surface of the first electrode 311. In addition, the magnetic layer may also be formed on the arrangement region in the first electrode so that the ultra-thin LED elements 106 may be moved to the arrangement region and disposed upright. The magnetic layer may be a paramagnetic material or a ferromagnetic material. In addition, the magnetic layer 73 may have a thickness of, for example, 0.1 nm to 500 nm, but the present disclosure is not particularly limited thereto.

Thereafter, fixing the ultra-thin LED elements 104, 105, or 106 disposed upright on the first electrodes 311, 312, and 313 and ohmic-contacting the ultra-thin LED elements with the first electrodes 311, 312, and 313 may be further performed. For example, the fixing and ohmic-contacting may be performed by performing a rapid thermal annealing (RTA) process on interfaces between the first electrodes 311, 312, and 313 and the ultra-thin LED elements 101. Alternatively, a fixing layer having a low melting point is further provided on the sub-pixel site in the first electrodes 311, 312, and 313, and the ultra-thin LED elements 101 may be firmly fixed on the first electrodes 311, 312, and 313 by heating and solidifying the fixing layer by applying heat after the ultra-thin LED elements 101 are disposed upright on the arrangement region. The fixing layer may be, for example, a typical solder material used as an electrical/electronic material.

Meanwhile, in order to improve the electrical connectivity between the ultra-thin LED elements 101 and the first electrodes 311, 312, and 313, a process of forming the conductive metal layer 500 may be further performed after operation (3). The conductive metal layer 500 may be manufactured by patterning a line on which a conductive metal layer is to be deposited by applying a photolithography process using a photosensitive material, depositing the conductive metal layer, or patterning the deposited metal layer and then etching the metal layer. This process may be performed by suitably adopting a known method and Korean Patent Application No. 10-2016-0181410 disclosed by the inventors of the present disclosure may be referenced.

Further, for electrical insulation from the upper electrode line 320 to be formed in operation (4) to be described below, a process of forming the insulating layer 600 to a predetermined thickness on the lower electrode line 310 may be further performed. The insulating layer 600 may be formed through deposition of a known insulating material, for example, by depositing an insulating material such as $SiO_2$ or $SiN_x$ through a plasma-enhanced chemical vapor deposition (PECVD) method, or depositing an insulating material such as AlN or GaN through a metal-organic chemical vapor deposition (MOCVD) method, or depositing an insulating material such as $Al_2O$, $HfO_2$, or $ZrO_2$ through an atomic layer deposition (ALD) method. Meanwhile, it is preferable that the insulating layer 600 is formed so as not to cover the upper surface of the ultra-thin LED element 101 that is assembled upright, and to this end, the insulating layer may be formed through deposition to a thickness that does not cover the upper surface of the ultra-thin LED element 101, or, after depositing the insulating layer to a thickness covering the upper surface of the ultra-thin LED element 101, dry etching may be performed until the upper surface of the ultra-thin LED element 101 is exposed.

Next, as operation (4) according to the present disclosure, a process of forming the upper electrode line 320 including the second electrodes 321 and 322 to be electrically connected to sides opposite to one sides of the ultra-thin LED elements 104, 105, or 106, which are electrically connected to the first electrodes 311, 312, and 313, is performed. The upper electrode line 320 may be implemented by depositing an electrode material after patterning the electrode line using known photolithography, or by depositing an electrode material and then performing dry and/or wet etching. In this case, the electrode material may be a typical electrode material used as an electrode of an electrical/electronic material, and the present disclosure is not particularly limited thereto.

Thereafter, as operation (5) according to the present disclosure, a process of patterning the color conversion layer 700 on the upper electrode line 320 may be performed so that the plurality of sub-pixel sites S1, S2, S3, and S4 respectively become the sub-pixel sites S1, S2, S3, and S4 each expressing any one of blue, green, and red colors.

The ultra-thin LED elements 101 provided in the sub-pixel sites may emit blue light, white light, or UV light, and, in this case, a process of forming the color conversion layer 700, which is capable of converting emitted light into light having a light color different from a light color of the emitted light for implementing a color image, on the sub-pixel sites may be performed. Preferably, color reproducibility may be improved by further enhancing color purity, a short-wavelength transmission filter (not shown) may be formed on the sub-pixel site to improve emission efficiency of color converted light, for example, green/red light, of a front surface thereof so that light emission is changed from a rear surface of the color conversion layer 700 to the front surface, and the color conversion layer 700 may be formed in one region of an upper portion of the short-wavelength transmission filter.

When description is made based on a case in which the ultra-thin LED element 101 is a blue LED element, a short-wavelength transmission filter may be formed on the upper electrode line 320, and when a flat surface on which the upper electrode line 320 is formed is not flat, a planarization layer (not shown) for planarizing the flat surface on which the upper electrode line 320 is formed may be further formed, and the short-wavelength transmission filter may be formed on the planarization layer. The short-wavelength transmission filter may be a multilayer film in which thin films made of highly refractive and slightly refractive materials are repeatedly formed, and a composition of the multilayer film may be $[(0.125)SiO_2/(0.25)TiO_2/(0.125)SiO_2]_m$ (where m=the number of repeated layers, and m is 5 or more) to transmit a blue color and reflect a light color having a wavelength longer than the blue color. In addition, the short-wavelength transmission filter may have a thickness of 0.5 to 10 μm, but the present disclosure is not limited thereto. A method of forming the short-wavelength transmission filter may include one method among an e-beam method, a sputtering method, and an atomic layer deposition method, but the present disclosure is not limited thereto.

Next, the color conversion layer 700 may be formed on the short-wavelength transmission filter. Specifically, the color conversion layer 700 may be formed by patterning a green color conversion layer on the short-wavelength transmission filter corresponding to some sub-pixel sites selected from among the sub-pixel sites and patterning a red color conversion layer on the short-wavelength transmission filter corresponding to some sub-pixel sites selected from among the remaining sub-pixel sites. The method of forming the patterns may be performed by one or more methods selected from the group consisting of a screen printing method, a photolithography method, and a dispensing method. Meanwhile, a patterning order of the green color conversion layer and the red color conversion layer is not limited, and the layers may be simultaneously formed or may be formed in reverse order. In addition, the red color conversion layer and the green color conversion layer may be a color conversion layer known in lighting and display fields and may include a color conversion material such as a phosphor or the like that is excited by light emitted from, e.g., a color filter, or a blue LED element and converts the light into light having a desired light color, or may include a known color conversion material. As an example, the green color conversion layer may be a phosphor layer including a green phosphor, and specifically, may include at least one phosphor selected from the group consisting of $SrGa_2S_4$:Eu, $(Sr,Ca)_3SiO_5$:Eu, $(Sr,Ba,Ca)SiO_4$:Eu, $Li_2SrSiO_4$:Eu, $Sr_3SiO_4$:Ce,Li, β-SiALON:Eu, $CaSc_2O_4$:Ce, $Ca_3Sc_2Si_3O_{12}$:Ce, Caα-SiALON:Yb, Caα-SiALON:Eu, Liα-SiALON:Eu, $Ta_3Al_5O_{12}$:Ce, $Sr_2Si_5N_8$:Ce, $(Ca, Sr,Ba)Si_2O_2N_2$:Eu, $Ba_3Si_6O_{12}N_2$:Eu, γ-AlON:Mn, and γ-AlON:Mn,Mg, but the present disclosure is not limited thereto. In addition, the green color conversion layer may be a phosphor layer including a green quantum dot material, and specifically, may include one or more quantum dots selected from the group consisting of CdSe/ZnS, InP/ZnS, InP/GaP/ZnS, InP/ZnSe/ZnS, and perovskite green nanocrystals, but the present disclosure is not limited thereto.

Further, the red color conversion layer may be a phosphor layer including a red phosphor, and specifically, may include one or more phosphors selected from the group consisting of $(Sr,Ca)AlSiN_3$:Eu, $CaAlSiN_3$:Eu, $(Sr,Ca)S$:Eu, $CaSiN_2$:Ce, $SrSiN_2$:Eu, $Ba_2Si_5N_8$:Eu, CaS:Eu, CaS:Eu,Ce, SrS:Eu, SrS:Eu,Ce, and $Sr_2Si_5N_8$:Eu, but the present disclosure is not limited thereto. In addition, the red color conversion layer may be a phosphor layer including a red quantum dot material, and specifically, may include one or more quantum dots selected from the group consisting of CdSe/ZnS, InP/ZnS, InP/GaP/ZnS, InP/ZnSe/ZnS, and perovskite red nanocrystals, but the present disclosure is not limited thereto.

In some sub-pixel sites, only a short-wavelength transmission filter is disposed on the uppermost layer and a green color conversion layer and a red color conversion layer are not formed on a vertical upper portion, and thus blue light may be irradiated in some sub-pixel sites. On the other hand, green light may be irradiated on some sub-pixel sites at which the green color conversion layer is formed on the short-wavelength transmission filter through the green color conversion layer. In addition, since the red color conversion layer is formed on the short-wavelength transmission filter at the remaining sub-pixel sites, red light may be irradiated on the remaining sub-pixel sites, and thus a color-by-blue LED display may be implemented as the first embodiment.

In addition, a long-wavelength transmission filter may be further formed on the upper portion of the substrate including the green and red color conversion layers, and the long-wavelength transmission filter serves as a filter for preventing the color purity from being degraded by mixing the blue light emitted from the element and the color-converted green/red light. The long-wavelength transmission filter may be formed on a part or all of the green color conversion layer and the red color conversion layer, and preferably, may be formed only on the green/red color conversion layer. In this case, the usable long-wavelength transmission filter may be a multilayer film in which thin films made of highly refractive and slightly refractive materials, which are capable of achieving the purpose of transmission of light having a long wavelength and reflection of light having a short wavelength to reflect blue light are repeatedly formed, and a composition of the multilayer film may be $[(0.125)TiO_2/(0.25)SiO_2/(0.125)TiO_2]_m$ (where m=the number of repeated layers, and m is 5 or more). In addition, the long-wavelength transmission filter may have a thickness of 0.5 to 10 μm, but the present disclosure is not limited thereto. The method of forming the long-wavelength transmission filter may include one method among an e-beam method, a sputtering method, and an ALD method, but the present disclosure is not limited thereto. In addition, in order to form the long-wavelength transmission filter only on the green and red color conversion layers, the long-wavelength transmission filter may be formed only in a desired region using a metal mask capable of exposing the green and red color conversion layers and masking the other regions.

Figure 3:
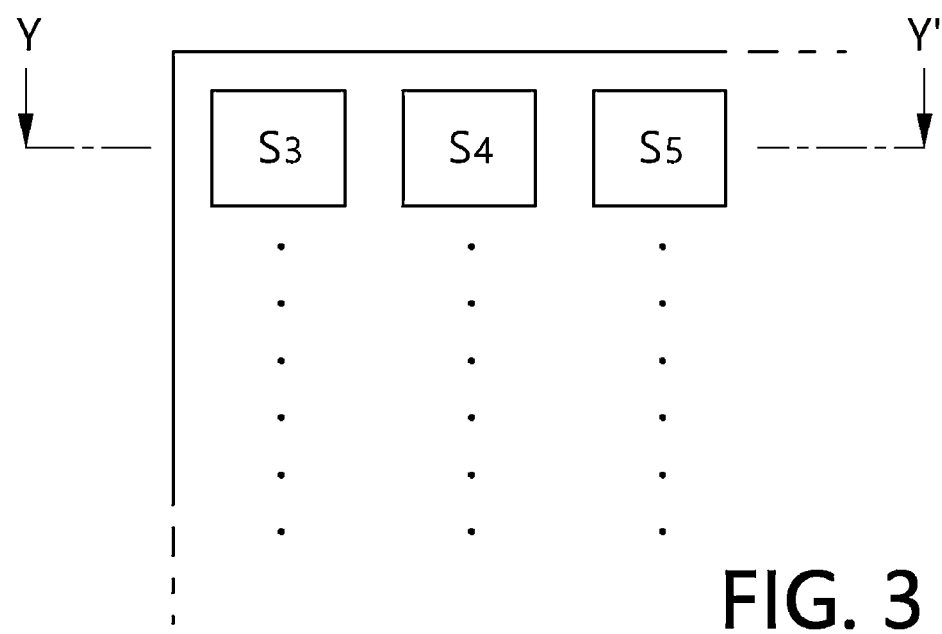
FIGS. 3 and 4 are a schematic plan view of a full-color LED display according to a second embodiment of the present disclosure and a schematic cross-sectional view taken along boundary line Y-Y' of FIG. 3, respectively.
Figure 4:
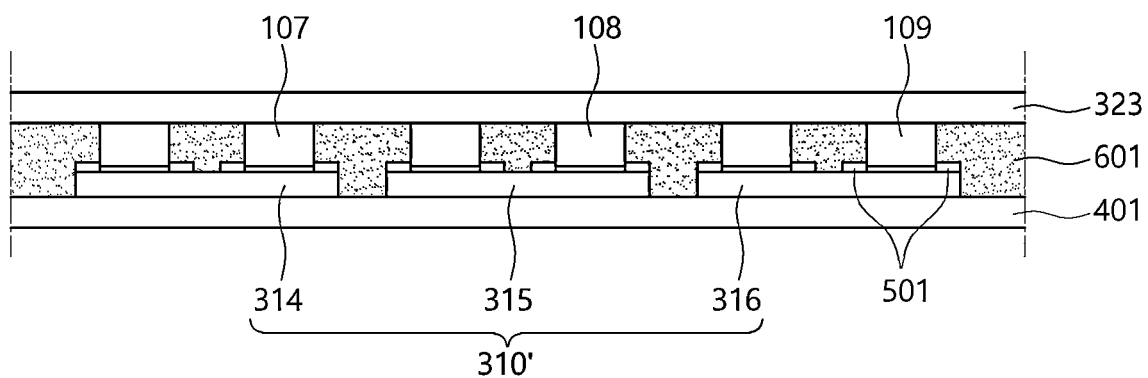

Next, when a full-color display according to a second embodiment of the present disclosure is described with reference to FIGS. 3 and 4, a full-color LED display 2000 is implemented by including a lower electrode line 310' including first electrodes 314, 315, and 316 in which a plurality of sub-pixel sites S5, S6, and S7 are formed, a plurality of ultra-thin LED elements 107, 108, and 109, each of which independently emits blue, green or red light, includes a first conductive semiconductor layer, a photoactive layer, and a second conductive semiconductor layer, has a ratio, between a thickness, which is a stacking direction of layers, and a length of a major axis in a cross section perpendicular to the stacking direction, of 1:0.5 to 1.5, wherein at least two elements emitting light of substantially the same color are disposed in each of the sub-pixel sites S5, S6, and S7 so that each of the plurality of sub-pixel sites S5, S6, and S7 independently expresses any one of blue, green, and red colors, and an upper electrode line including a second electrode 323 disposed to be in contact with upper portions of the plurality of ultra-thin LED elements 107, 108, and 109.

The second embodiment is different from the first embodiment in that the above-described full-color LED display 1000 according to the first embodiment includes the ultra-thin LED elements 101 emitting light of substantially the same color, whereas the full-color LED display 2000 according to the second embodiment uses the plurality of ultra-thin LED elements 107, 108, and 109 of three types each emitting blue, green, or red light, and at least two elements capable of independently emitting light of any one of blue, green, and red colors are disposed in each of the sub-pixel sites S5, S6, and S7. In addition, since the elements themselves disposed in the sub-pixel sites S5, S6, and S7 emit desired blue, green, or red light, a separate color conversion layer is not required on the second electrode 323. Meanwhile, the full-color LED display 2000 according to the second embodiment may further include a substrate 401 on which the first electrodes 314, 315, and 316 are formed, a conductive metal layer 501 for reducing the resistance of contact portions between the first electrodes 314, 315, and 316 and the ultra-thin LED elements 107, 108, and 109, and an insulating layer 601 filling a gap between the first electrodes 314, 315, and 316 and the second electrode 323.

Further, the above-described full-color LED display 2000 according to the second embodiment may be manufactured by including operation (I) of preparing a lower electrode line 310' including first electrodes 314, 315, and 316 in which a plurality of sub-pixel sites S5, S6, and S7 are formed, operation (II) of processing a blue ultra-thin LED element ink composition, a green ultra-thin LED element ink composition, and a red ultra-thin LED element ink composition each including a plurality of ultra-thin LED elements 107, 108, and 109 for each light color, each of which includes a first conductive semiconductor layer, a photoactive layer, and a second conductive semiconductor layer which are stacked and has a ratio, between a thickness in a stacking direction and a length of a major axis of a cross section perpendicular to the stacking direction, of 1:0.5 to 1.5, on the first electrodes 314, 315, and 316, wherein the ink compositions are processed such that the plurality of sub-pixel sites each independently express any one of blue, green, and red light colors, and at least two ultra-thin LED elements are disposed in each of the sub-pixel sites S5, S6, and S7, operation (III) of assembling the processed ultra-thin LED elements 107, 108, and 109 on the first electrodes 314, 315, and 316 to be upright in a thickness direction in the sub-pixel sites S5, S6, and S7, and operation (IV) of forming an upper electrode line including a second electrode 323 to be electrically connected to sides opposite to one sides of the ultra-thin LED elements 107, 108, and 109 assembled on the first electrodes 314, 315, and 316.

Each operation of the manufacturing method according to the second embodiment is the same as the manufacturing method according to the first embodiment except that in operation (II), three kinds of ink compositions containing ultra-thin LED elements expressing three different colors are used, and thus a detailed description thereof will be omitted. In addition, an ultra-thin LED element that emits light of a different color from the three light colors included in the second embodiment may be further used, and thus the ink composition for the different color may also be included.

The present disclosure will be described in more detail through the following Examples, but the following Examples do not limit the scope of the present disclosure, and it should be understood that the following Examples are intended to assist the understanding of the present disclosure.

PREPARATION EXAMPLE 1

Figure 18:
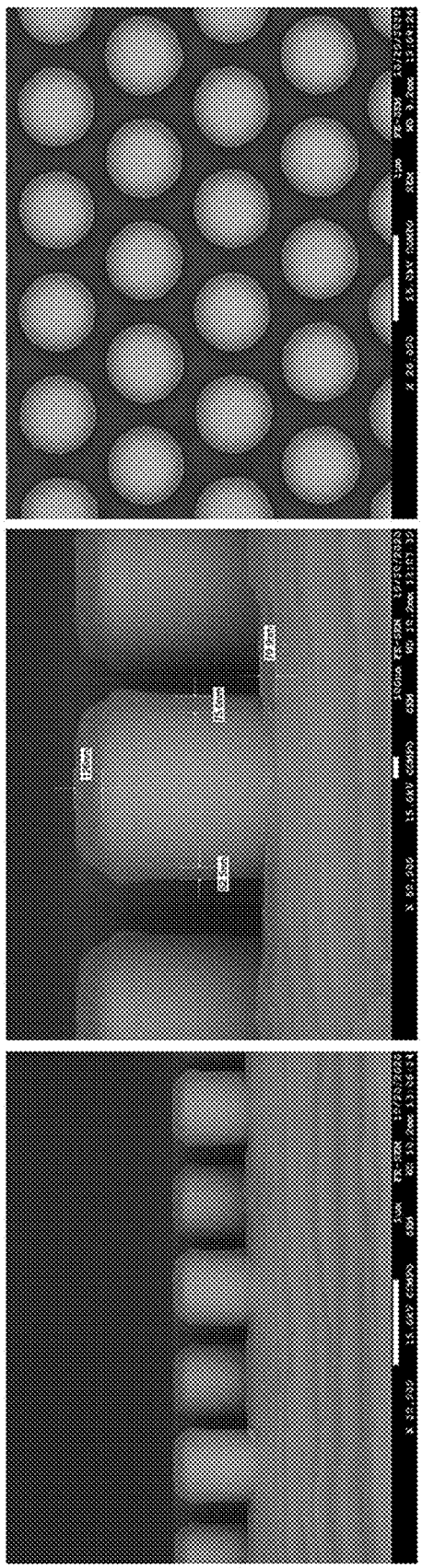
FIGS. 18 and 19 are scanning electron microscope (SEM) images in a specific operation of a manufacturing method of an ultra-thin LED element used in one embodiment of the present disclosure.

A typical LED wafer (manufactured by Epistar Corporation), in which an undoped n-type III-nitride semiconductor layer, an n-type III-nitride semiconductor layer doped with Si (with a thickness of 4 µm), a photoactive layer (with a thickness of 0.45 µm), and a p-type III-nitride semiconductor layer (with a thickness of 0.05 µm) are sequentially stacked on a substrate, was prepared. ITO (with a thickness of 0.15 µm) as a first electrode layer, $SiO_2$ (with a thickness of 1.2 µm) as a first mask layer, and Al (with a thickness of 0.2 µm) as a second mask layer were sequentially deposited on the prepared LED wafer, and then a spin-on-glass (SOG) resin layer onto which a pattern is transferred was transferred onto the second mask layer using nanoimprint equipment. Thereafter, the SOG resin layer was cured using RIE, and a residual resin portion of the resin layer was etched through RIE to form a resin pattern layer. After that, the second mask layer was etched along the pattern using ICP, and the first mask layer was etched using RIE. Next, after the first electrode layer, the p-type III-nitride semiconductor layer, and the photoactive layer were etched using ICP, the doped n-type III-nitride semiconductor layer was etched to a thickness of 0.78 µm, and then, an LED wafer, on which a plurality of LED structures (with a diameter of 850 nm and a height of 850 nm) are formed through KOH wet etching so that a side surface of the etched doped n-type III-nitride semiconductor layer is perpendicular to a layer surface, was manufactured. After that, a SiNx protective film material was deposited on the LED wafer on which the plurality of LED structures are formed (deposition thicknesses of 52.5 nm and 72.5 nm based on a side surface of the LED structure, see a scanning electron microscope (SEM) image of FIG. 18), and then, the protective film material formed between the plurality of LED structures was removed using a reactive ion etcher to expose an upper surface 51 of a first portion a of the doped n-type III-nitride semiconductor layer.

Figure 19:
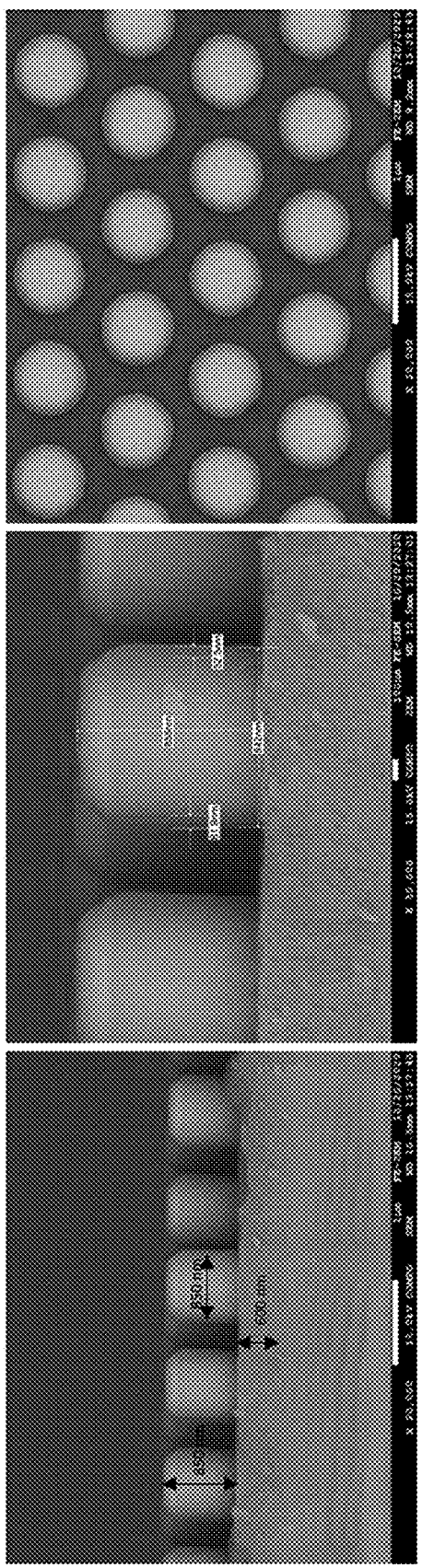
Figure 20:
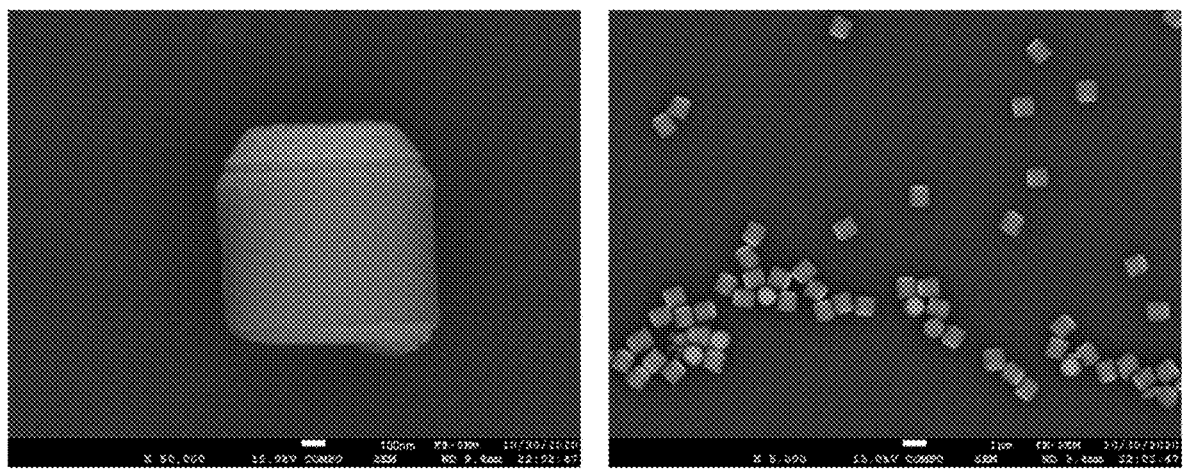
FIG. 20 is a SEM image of an ultra-thin LED element used in one embodiment of the present disclosure.
Figure 21:
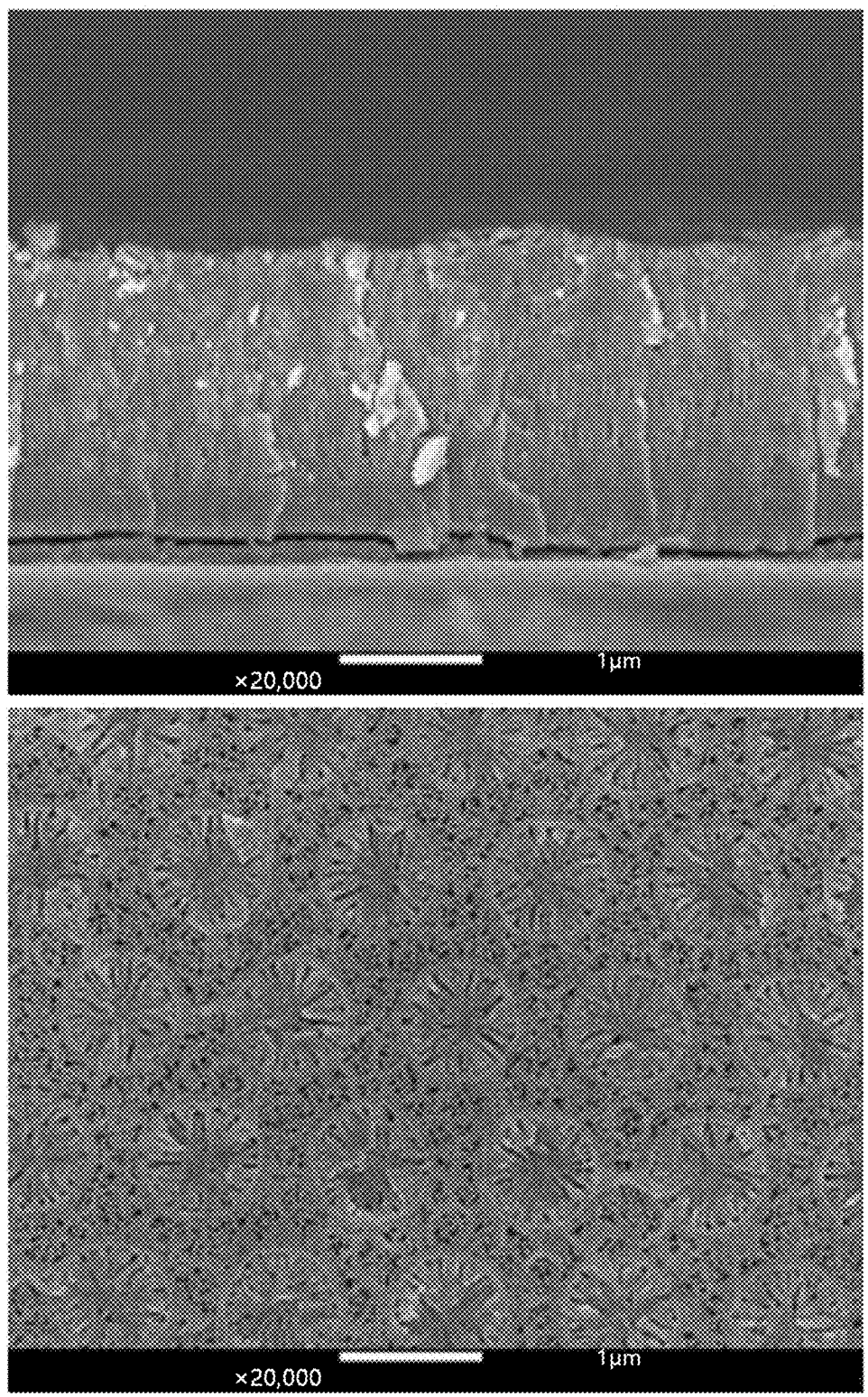
FIG. 21 is a SEM image of an LED wafer remaining after an ultra-thin LED element is manufactured through a process of manufacturing an ultra-thin LED element used in one embodiment of the present disclosure.

Then, the LED wafer on which a temporary protective film was formed was immersed in an electrolyte which is a 0.3M oxalic acid solution and connected to an anode terminal of a power supply, a cathode terminal was connected to a platinum electrode immersed in the electrolyte, and then, a voltage of 10 V was applied for 5 minutes to form a plurality of pores from the surface of the first portion a of the doped n-type III-nitride semiconductor layer to a depth of 600 nm as shown in a SEM image of FIG. 19. Next, after the temporary protective film was removed through ME, a surface protective film made of $Al_2O_3$ was deposited again on the LED wafer to a thickness of 50 nm based on the side surface of the LED structure, the surface protective film formed on the plurality of LED structures and the surface protective film formed on the upper surface S1 of the first portion a of the doped n-type III-nitride semiconductor layer were removed through ICP to expose the upper surface S1 of the first portion a of the semiconductor layer and an upper surface of the LED structure. Next, after the LED wafer was immersed in a bubble-forming solution of gamma-butyllactone, ultrasonic waves were radiated at a frequency of 40 kHz for 10 minutes to collapse the pores formed in the doped n-type III-nitride semiconductor layer using generated bubbles and separate the plurality of LED structures from the wafer as shown in a SEM image of FIG. 20, thereby manufacturing an ultra-thin LED element aggregate including ultra-thin LED elements. In addition, as shown in FIG. 21, it can be confirmed that there is no LED structure that is not separated from the wafer.

COMPARATIVE PREPARATION EXAMPLE 1

A nano rod-type LED element aggregate having the same stacked structure as in Example 1 and having a diameter of 650 nm and a height of 4.2 µm was manufactured from an LED wafer through a typical method.

EXPERIMENTAL EXAMPLE 1

Each of the LED element aggregates manufactured through Preparation Example 1 and Comparative Preparation Example 1 was put into acetone and dispersed by being irradiated with ultrasonic waves under a 100 W condition, and then the dispersed state of the LED element was measured by measuring absorbance for 2 hours at 15-minute intervals. A spectral area of the visible light region of 380 to 780 nm was normalized using the measured result, and an absorbance graph over time is shown in FIG. 22.

Figure 22:
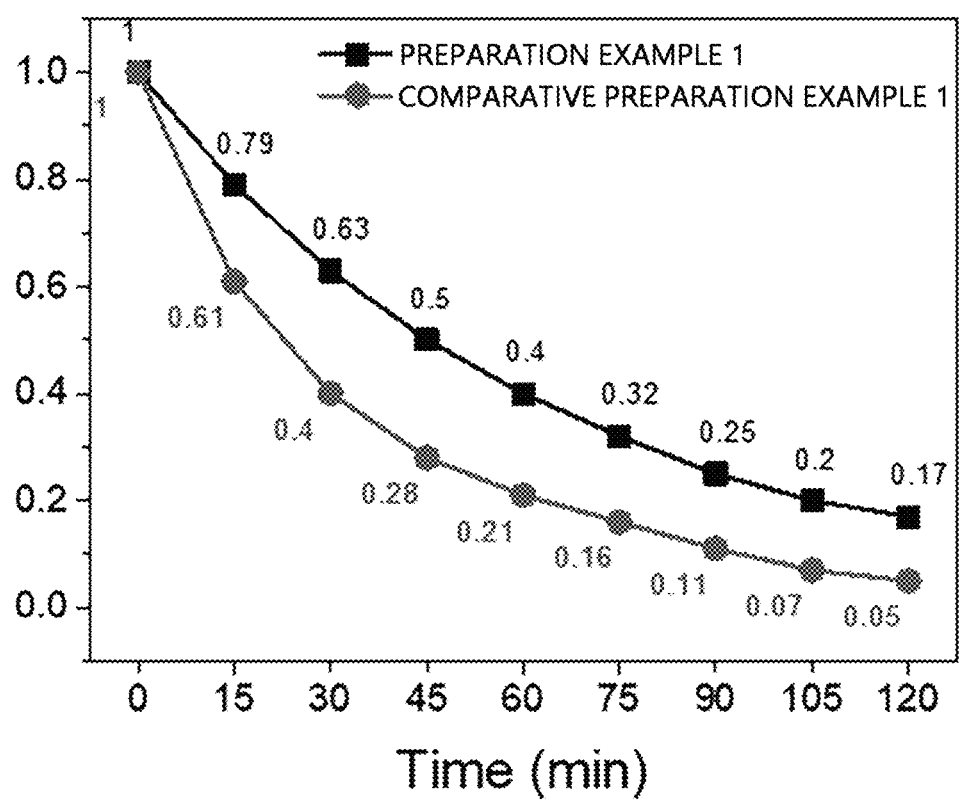
FIG. 22 is an absorbance graph over time generated by normalizing a spectral area of visible light regions of 380 to 780 nm using absorbance for each wavelength measured for each time in ink compositions in which ultra-thin LED elements and rod-type LED elements are dispersed in acetone.

As can be confirmed from FIG. 22, it can be seen that the ultra-thin LED element according to Preparation Example 1 has excellent dispersion retention performance in an acetone solvent for a long time as compared with the nanorod-type LED element according to Comparative Preparation Example 1.

A full-color LED display according to the present disclosure can be implemented through inkjet printing by forming ultra-thin LED elements into ink, so that a large-area display can be implemented more easily. In addition, it is advantageous in achieving high luminance and emission efficiency by increasing an emission area of an element as compared with a display using a conventional nanorod-type LED element. In addition, it is possible to prevent or minimize a decrease in luminance of a display because an area of a photoactive layer exposed on the surface can be greatly reduced while increasing an emission area of an element to prevent or minimize a decrease in efficiency due to surface defects. Furthermore, since an electron-hole recombination rate due to non-uniformity of electron and hole velocities can be optimized in the used LED element, more improved emission efficiency can be achieved, so that a display having high luminance can be implemented. In addition, an electrode arrangement for implementing sub-pixels can be easily and simply designed and also is not difficult to implement, and thus it can be widely applied to various displays.

While the embodiments of the present disclosure have been described above, the present disclosure is not limited to the embodiments presented herein. One skilled in the art may easily suggest other embodiments due to addition, modification, deletion, and the like of components within the scope and spirit of the present disclosure, and the addition, modification, deletion, and the like of the components fall within the scope and spirit of the present disclosure.

What is claimed is:

1. A full-color light-emitting diode (LED) display, comprising:
    a lower electrode line including a first electrode on which a plurality of sub-pixel sites are formed;
    a plurality of ultra-thin LED elements emitting light of substantially the same color, which are disposed so that at least two thereof are provided in each of the sub-pixel sites, and each of which comprises a first conductive semiconductor layer which is an n-type III-nitride semiconductor layer, a photoactive layer, a second conductive semiconductor layer which is an p-type III-nitride semiconductor layer, and at least one film of a hole pushing film and an electron pushing film, has a ratio, between a thickness, which is a stacking direction of layers, and a length of a major axis in a cross section perpendicular to the stacking direction, of 1:0.5 to 1.5, and is disposed upright on the first electrode in the stacking direction of the layers,
    wherein the hole pushing film is configured to surround exposed side surfaces of the second conductive semiconductor layer, or the exposed side surfaces of the second conductive semiconductor layer and exposed side surfaces of at least a portion of the photoactive layer, and move holes at a surface side of the exposed side surface toward a center, and wherein the electron pushing film is configured to surround exposed side surfaces of the first conductive semiconductor layer and move electrons at a surface side of the exposed side surface toward a center;
    an upper electrode line including a second electrode disposed on the plurality of ultra-thin LED elements; and
    a color conversion layer patterned on the second electrode corresponding to the sub-pixel site so that each sub-pixel site becomes a sub-pixel site expressing one of blue, green, and red colors.

2. The full-color LED display of claim 1, further comprising an alignment-inducing layer configured to allow the ultra-thin LED element to be disposed upright in a thickness direction, and formed on one side of the ultra-thin LED element in the thickness direction and on one side or both sides of the sub-pixel site in the first electrode,
    wherein the alignment-inducing layer is a magnetic layer, a charge layer, or a bonding layer.

3. The full-color LED display of claim 1, wherein the ultra-thin LED element has a maximum surface area of 16 µm² or less.

4. The full-color LED display of claim 1, wherein the ultra-thin LED element has a thickness of 2.7 µm or less.

5. The full-color LED display of claim 1, wherein in the ultra-thin LED element,
    an electron delay layer is further included on a surface opposite to one surface of the first conductive semiconductor layer adjacent to the photoactive layer so that the number of electrons and holes recombined in the photoactive layer is balanced.

6. The full-color LED display of claim 5, wherein the electron delay layer includes one or more selected from the group consisting of CdS, GaS, ZnS, CdSe, CaSe, ZnSe, CdTe, GaTe, SiC, ZnO, ZnMgO, $SnO_2$, $TiO_2$, $In_2O_3$, $Ga_2O_3$, Si, polyparaphenylene vinylene, derivatives thereof, polyaniline, poly (3-alkylthiophene), and poly (paraphenylene).

7. The full-color LED display of claim 5, wherein the electron delay layer is a III-nitride semiconductor having a lower doping concentration than the first conductive semiconductor layer.

8. The full-color LED display of claim 1, further comprising a protective film surrounding exposed side surfaces of the ultra-thin LED element.

9. The full-color LED display of claim 1, wherein the ultra-thin LED element includes both the hole pushing film and the electron pushing film, wherein the electron pushing film is provided as an outermost film configured to surround side surfaces of the first conductive semiconductor layer, the photoactive layer, and the second conductive semiconductor layer.

10. The full-color LED display of claim 1, wherein the light color is blue, white, or ultraviolet (UV).

* * * * *